United States Patent
Hong et al.

(10) Patent No.: US 10,910,367 B2
(45) Date of Patent: Feb. 2, 2021

(54) SEMICONDUCTOR DEVICE AND METHOD OF FABRICATING THE SAME

(71) Applicant: Samsung Electronics Co., Ltd., Suwon-si (KR)

(72) Inventors: Seul-ki Hong, Seoul (KR); Hwi-chan Jun, Yongin-si (KR); Hyun-soo Kim, Hwaseong-si (KR); Dae-chul Ahn, Suwon-si (KR); Myung Yang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 41 days.

(21) Appl. No.: 16/257,464

(22) Filed: Jan. 25, 2019

(65) Prior Publication Data

US 2020/0027875 A1    Jan. 23, 2020

(30) Foreign Application Priority Data

Jul. 20, 2018  (KR) .................. 10-2018-0084763

(51) Int. Cl.
| | | |
|---|---|---|
| *H01L 27/07* | (2006.01) | |
| *H01L 29/66* | (2006.01) | |
| *H01L 21/8238* | (2006.01) | |
| *H01L 29/78* | (2006.01) | |
| *H01L 21/768* | (2006.01) | |

(Continued)

(52) U.S. Cl.
CPC .... *H01L 27/0738* (2013.01); *H01L 21/76832* (2013.01); *H01L 21/823814* (2013.01); *H01L 21/823821* (2013.01); *H01L 21/823828* (2013.01); *H01L 21/823871* (2013.01); *H01L 21/823878* (2013.01); *H01L 23/3171* (2013.01); *H01L 28/20* (2013.01);

(Continued)

(58) Field of Classification Search
CPC ............. H01L 27/0738; H01L 27/0924; H01L 27/0629; H01L 29/7851; H01L 29/66545; H01L 29/66795
See application file for complete search history.

(56) References Cited

U.S. PATENT DOCUMENTS

| | | |
|---|---|---|
| 7,397,087 B2 | 7/2008 | Chinthakindi et al. |
| 8,013,394 B2 | 9/2011 | Chinthakindi et al. |

(Continued)

FOREIGN PATENT DOCUMENTS

KR    10-0599949 B1    7/2006

*Primary Examiner* — Mark V Prenty
(74) *Attorney, Agent, or Firm* — Harness, Dickey & Pierce, P.L.C.

(57) ABSTRACT

A semiconductor device includes a substrate including a first region and a second region, an active gate structure on the substrate in the first region, a dummy gate structure on the substrate in the second region, a source/drain on the substrate in the first region at each of opposite sides of the active gate structure, a plurality of first conductive contacts respectively connected to the active gate structure and the source/drain, a resistive structure on the dummy gate structure in the second region, a plurality of second conductive contacts respectively connected to the plurality of first conductive contacts and the resistive structure, and an etch stop layer between the dummy gate structure and the resistive structure. The etch stop layer includes a lower etch stop layer and an upper etch stop layer, which are formed of different materials.

15 Claims, 24 Drawing Sheets

(51) Int. Cl.
*H01L 23/31* (2006.01)
*H01L 49/02* (2006.01)
*H01L 29/06* (2006.01)

(52) U.S. Cl.
CPC .... *H01L 29/0642* (2013.01); *H01L 29/66545* (2013.01); *H01L 29/66795* (2013.01); *H01L 29/7851* (2013.01)

(56) References Cited

U.S. PATENT DOCUMENTS

| | | |
|---|---|---|
| 8,212,649 B2 | 7/2012 | Fujiwara et al. |
| 9,443,851 B2 | 9/2016 | Sengupta et al. |
| 9,502,284 B2 | 11/2016 | Ali et al. |
| 9,640,529 B2 | 5/2017 | Song et al. |
| 9,865,593 B1 | 1/2018 | Lu et al. |
| 2004/0238962 A1 | 12/2004 | Jung et al. |
| 2017/0256505 A1 | 9/2017 | Takizawa et al. |
| 2020/0027875 A1* | 1/2020 | Hong ................ H01L 28/20 |

* cited by examiner

SEMICONDUCTOR DEVICE AND METHOD OF FABRICATING THE SAME

CROSS-REFERENCE TO RELATED APPLICATION

This application claims the benefit of Korean Patent Application No. 10-2018-0084763, filed on Jul. 20, 2018, in the Korean Intellectual Property Office, the disclosure of which is incorporated herein in its entirety by reference.

BACKGROUND

Inventive concepts relates to a semiconductor device and a method of fabricating the same, and more particularly, to a semiconductor device including a resistive element and a method of fabricating the same.

Sizes of semiconductor devices are becoming smaller and smaller to achieve high-capacity and highly integrated semiconductor devices. In order to increase a degree of integration of semiconductor devices per unit area, the sizes of the semiconductor devices and the distances between the semiconductor devices are reduced, thereby increasing the density of the semiconductor devices. In general, a semiconductor device may be configured to include active elements and passive elements. A resistive element, which is one of the passive elements, may be used to operate an integrated circuit and may be formed of a metal material.

SUMMARY

Inventive concepts provides a semiconductor device capable of improving electrical characteristics and simplifying a manufacturing process to reduce process difficulty, and including a resistive element.

Inventive concepts also provides a method of manufacturing a semiconductor device capable of improving electrical characteristics and simplifying a manufacturing process to reduce process difficulty, and including a resistive element.

Other aspects of inventive concepts are not limited thereto and will be clearly understood by those skilled in the art from the following description.

According to an aspect of inventive concepts, a semiconductor device includes a substrate including a first region and a second region; an active gate structure on the substrate in the first region; a dummy gate structure on the substrate in the second region; a source/drain on the substrate in the first region at opposite sides of the active gate structure; a plurality of first conductive contacts respectively connected to the active gate structure and the source/drain; a resistive structure on the dummy gate structure in the second region; a plurality of second conductive contacts respectively connected to the plurality of first conductive contacts and the resistive structure; and an etch stop layer between the dummy gate structure and the resistive structure. The etch stop layer includes a lower etch stop layer and an upper etch stop layer. A material of the lower etch stop layer may be different than a material of the upper etch stop layer.

According to another aspect of inventive concepts, a semiconductor device includes a fin region protruding from a substrate; a gate structure crossing the fin region, the gate structure covering a top surface and opposite sidewalls of the fin region; a source/drain at opposite sides of the gate structure in the fin region; a source/drain contact connected to the source/drain, and a gate contact connected to the gate structure; an etch stop layer on the gate structure; a resistive structure on the etch stop layer; a plurality of merged contacts connected to the source/drain contact or the gate contact, respectively; and a resistive contact connected to the resistive structure. The etch stop layer includes a lower etch stop layer, a passivation layer, and an upper etch stop layer sequentially stacked on top of each other.

According to another aspect of inventive concepts, a method of fabricating a semiconductor device includes forming an active gate structure and a dummy gate structure on a substrate, the substrate including a first region and a second region, the active gate structure being formed on the substrate in the first region, and the dummy gate structure being formed on the substrate in the second region; forming a source/drain on the substrate in the first region at opposite sides of the active gate structure; forming a lower interlayer insulating film on the substrate, the lower interlayer insulating film covering sidewalls of the active gate structure and covering sidewalls of the dummy gate structure, and the lower interlayer insulating film exposing a top surface of the active gate structure and a top surface of the dummy gate structure; forming a plurality of first conductive contacts respectively connected to the active gate structure and the source/drain; forming an etch stop layer on the lower interlayer insulating film and the plurality of first conductive contacts, the etch stop layer including a lower etch stop layer and an upper etch stop layer; forming a resistive structure on the etch stop layer in the second region; forming an upper interlayer insulating film covering the etch stop layer and the resistive structure; and forming a plurality of second conductive contacts connected to the plurality of first conductive contacts while passing through the upper interlayer insulating film and the etch stop layer, and forming a plurality of second conductive contacts connected to the resistive structure while passing through the upper interlayer insulating film.

BRIEF DESCRIPTION OF THE DRAWINGS

Embodiments of inventive concepts will be more clearly understood from the following detailed description taken in conjunction with the accompanying drawings in which:

FIGS. 7A to 7C are diagrams illustrating a modified example of an etch stop layer, in which FIG. 7A is a cross-sectional view taken along line A-A' of FIG. 1, FIG. 7B is a cross-sectional view taken along line B-B' of FIG. 1, and FIG. 7C is a cross-sectional view taken along line C-C' of FIG. 1;

DETAILED DESCRIPTION OF THE EMBODIMENTS

Hereinafter, embodiments of inventive concepts will be described in detail with reference to the accompanying drawings.

Figure 1:
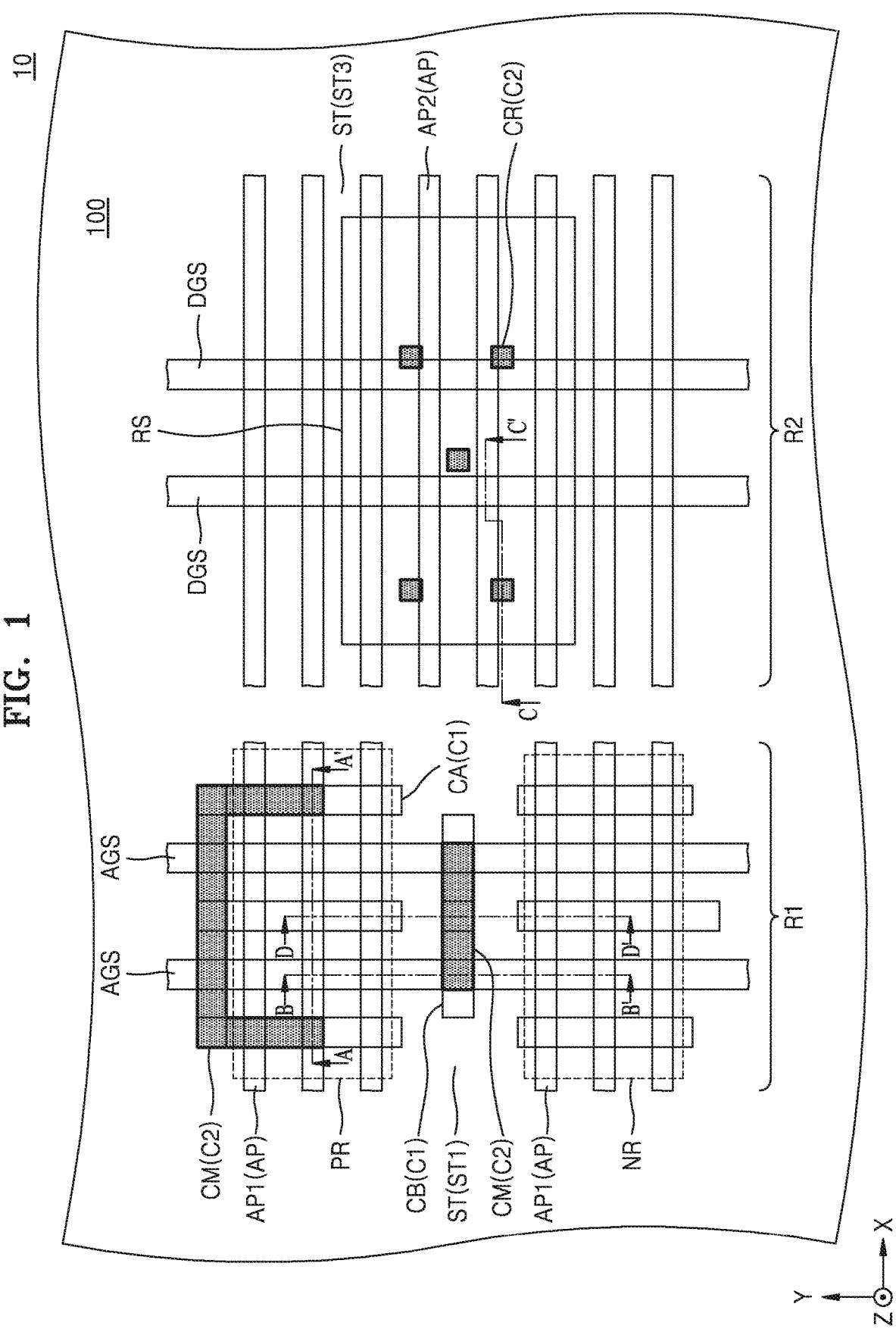
FIG. 1 is a plan view of a layout of a semiconductor device according to an embodiment of inventive concepts.

FIG. 1 is a plan view of a layout of a semiconductor device 10 according to an embodiment of inventive concepts.

Referring to FIG. 1, a substrate 100 including a first region R1 and a second region R2 may be provided. An active gate structure AGS may be provided on the substrate 100 in the first region R1, and a dummy gate structure DGS may be provided on the substrate 100 in the second region R2.

In an embodiment of inventive concepts, the semiconductor device 10 may include a resistive structure RS on the substrate 100 in the second region R2, which is one of passive elements on the dummy gate structure DGS.

The resistive structure RS may be provided, for example, in the form of a flat plate having a long axis in a first direction X or a second direction Y perpendicular to the first direction X. However, a shape of the resistive structure RS is not limited thereto.

At least one resistive contact CR may be electrically connected to the resistive structure RS. The resistive contact CR may be provided for electrical connection between the resistive structure RS and interlayer wirings.

The dummy gate structure DGS may be provided between the substrate 100 and the resistive structure RS. The dummy gate structure DGS may be in the form of a line extending in the second direction Y, and a plurality of dummy gate structures DGS may be spaced apart from each other in the first direction X. The dummy gate structure DGS may be provided to lessen a pattern density difference between the first region R1 in which a memory cell or a logic circuit is formed and the second region R2 in which the resistive structure RS is formed. In some embodiments, the dummy gate structure DGS may not be provided below a portion of the resistive contact CR.

In some embodiments, an active pattern AP may be provided between substrate 100 and the dummy gate structure DGS. The active pattern AP may be in the form of a line extending in the first direction X and a plurality of active patterns AP may be spaced apart from each other in the second direction Y. That is, the active pattern AP may cross the dummy gate structure DGS at right angles. The active pattern AP may protrude in a third direction Z perpendicular to a top surface of the substrate 100. In other embodiments, the active pattern AP may be omitted from second region R2 unlike that illustrated in FIG. 1.

Figure 2A:
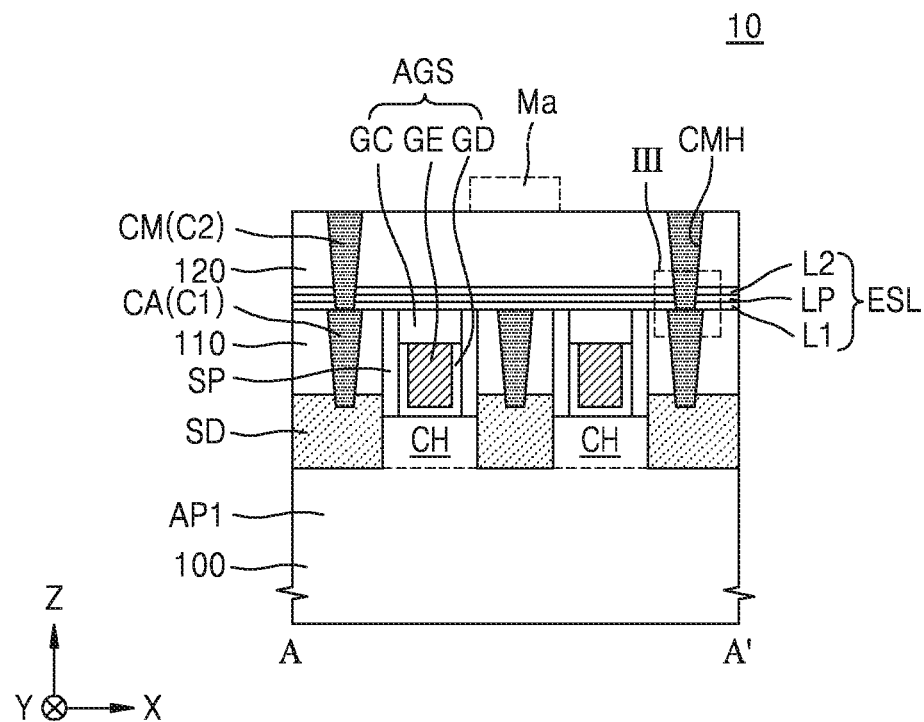
FIG. 2A is a cross-sectional view taken along line A-A' of FIG. 1.
Figure 2B:
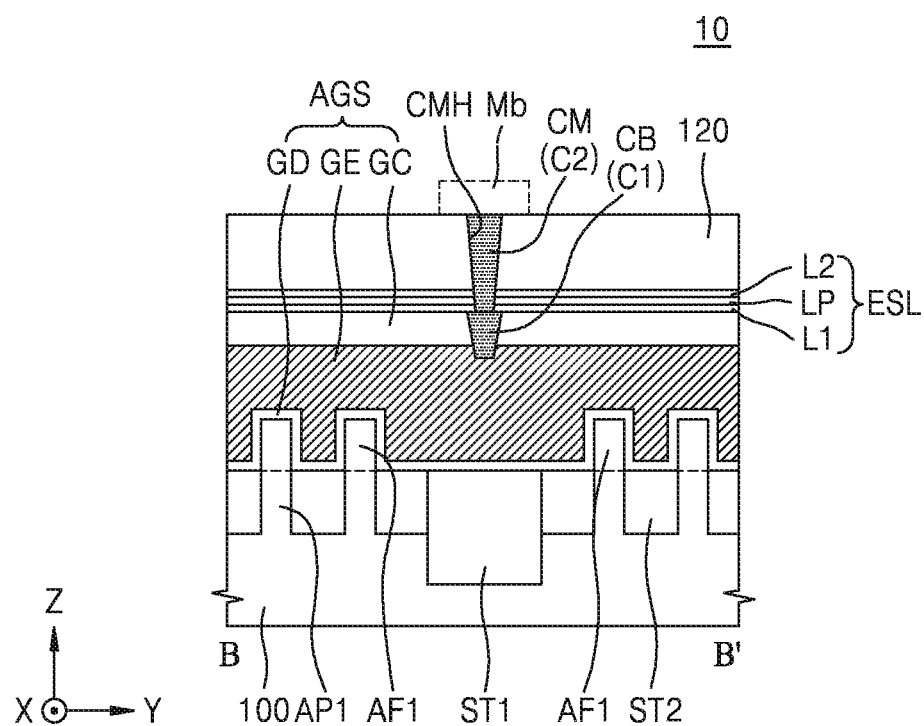
FIG. 2B is a cross-sectional view taken along line B-B' of FIG. 1.
Figure 2C:
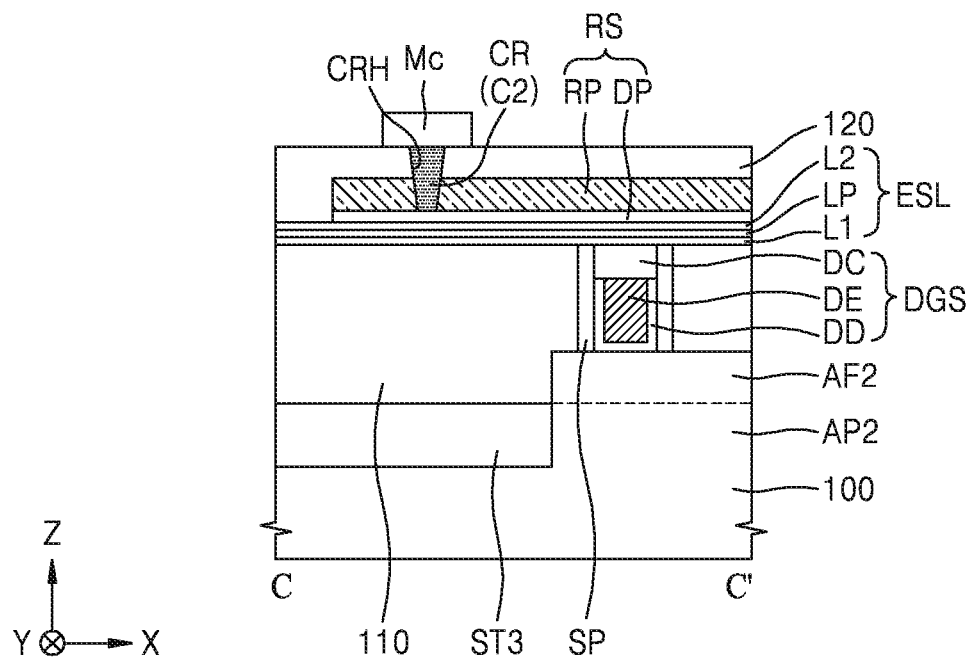
FIG. 2C is a cross-sectional view taken along line C-C' of FIG. 1.
Figure 2D:
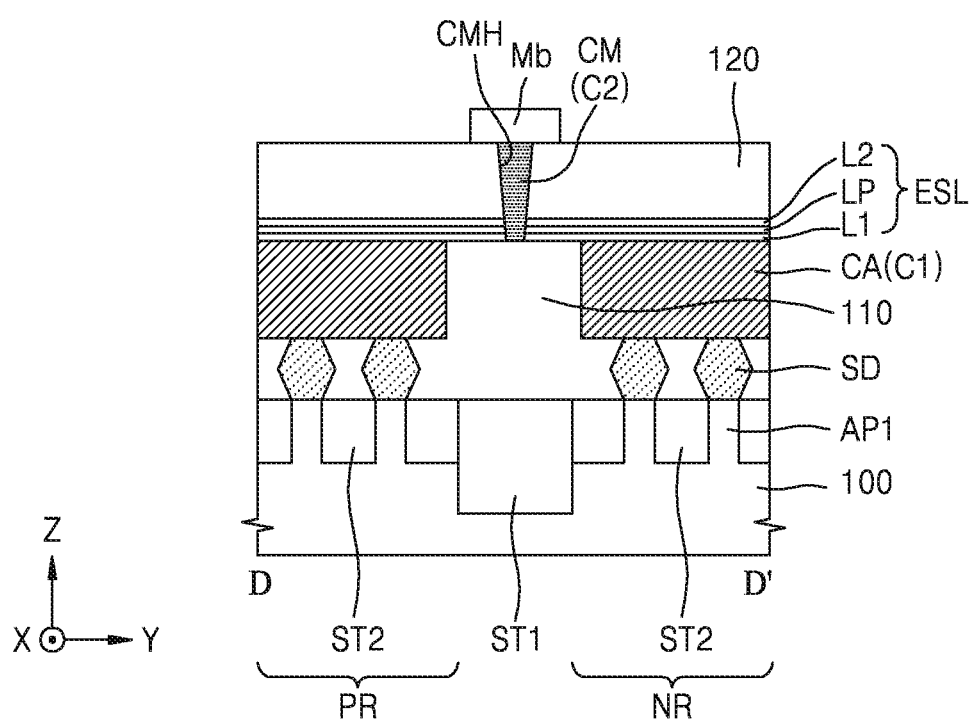
FIG. 2D is a cross-sectional view taken along line D-D' of FIG. 1.

FIG. 2A is a cross-sectional view taken along line A-A' of FIG. 1. FIG. 2B is a cross-sectional view taken along line B-B' of FIG. 1. FIG. 2C is a cross-sectional view taken along line C-C' of FIG. 1. FIG. 2D is a cross-sectional view taken along line D-D' of FIG. 1.

Referring to FIGS. 1 and 2A to 2D, the semiconductor device 10 according to an embodiment of inventive concepts may include the resistive structure RS on dummy gate structure DGS located on the substrate 100 in the second region R2.

The substrate 100 may include a semiconductor substrate. In some embodiments, the substrate 100 may include a silicon (Si) or germanium (Ge) semiconductor, or a compound semiconductor such as a SiGe, SiC, GaAs, InAs, or InP semiconductor. In other embodiments, the substrate 100 may have a silicon-on-insulator (SOI) structure, and a conductive region, e.g., an impurities-doped well or structure.

The first region R1 may be either part of a logic cell region in which logic transistors of a logic circuit of the semiconductor device 10 are formed or part of a memory cell region in which a plurality of memory cells are formed to store data. For example, the first region R1 may include a pMOSFET region PR or an nMOSFET region NR. The pMOSFET region PR may be an active region in which p type transistors are arranged. The nMOSFET region NR may be an active region in which n type transistors are arranged. In some embodiments, a plurality of pMOSFET regions PR and a plurality of nMOSFET regions NR may be arranged in the second direction Y.

The second region R2 may be a region in which a passive element is formed. In the semiconductor device 10 according to an embodiment of inventive concepts, the passive element may be a resistive structure RS. That is, the second region R2 may be a resistive region included in an integrated circuit of the semiconductor device 10.

First activation patterns AP1 and second activation patterns AP2 may be provided on the substrate 100.

In detail, the first activation patterns AP1 may be provided in an active region of the first region R1. The first activation patterns AP1 may be spaced apart from each other in the second direction Y, and be in the form of a line extending in the first direction X. The first activation patterns AP1 may be arranged spaced substantially the same distance from each other in the active region of the first region R1. The first activation patterns AP1 may protrude in the third direction Z perpendicular to a top surface of the substrate 100. The first activation patterns AP1 may be part of the substrate 100 or an epitaxial layer formed on the substrate 100.

The second activation patterns AP2 may be provided on the substrate 100 in the second region R2. The second activation patterns AP2 may be provided in the second direction Y, and may be in the form of line extending in the first direction X. The second activation patterns AP2 may be arranged spaced substantially the same distance from each other on the substrate 100 in the second region R2. The second activation patterns AP2 may protrude in the third direction Z perpendicular to the top surface of the substrate 100. The second activation patterns AP2 may be part of the substrate 100 or an epitaxial layer formed on the substrate 100.

Isolation patterns ST may be arranged on the substrate 100. The isolation patterns ST may include first and second isolation patterns ST1 and ST2 in the first region R1, and third isolation patterns ST3 in the second region R2.

The first isolation pattern ST1 may be provided between the nMOSFET region NR and the pMOSFET region PR, thereby separating the nMOSFET region NR and the pMOSFET region PR.

The second isolation patterns ST2 may be provided at opposite sides of the first activation pattern AP1, via which an upper portion of the first activation pattern AP1 may be exposed. The exposed upper portion of the first activation pattern AP1 may be defined as a first activation fin AF1. That is, the first activation fin AF1 may be in the form of a fin protruding between the second isolation patterns ST2.

The third isolation patterns ST3 may be provided at opposite sides of the second activation pattern AP2, via which an upper portion of the second activation pattern AP2 may be exposed. The exposed upper portion of second activation pattern AP2 may be defined as a second activation fin AF2, and may be in the form of a fin protruding between the third isolation patterns ST3.

The first to third isolation patterns ST1, ST2, and ST3 may be connected to one another, i.e., may be substantially part of an insulating film. The first to third isolation patterns ST1, ST2, and ST3 may include, for example, a silicon oxide, a silicon nitride, or a silicon oxynitride.

In some embodiments, a thickness of the first isolation pattern ST1 may be greater than those of the second and third isolation patterns ST2 and ST3. That is, top surfaces of the first to third isolation patterns ST1, ST2, and ST3 may be at substantially the same level, whereas a bottom surface of the first isolation pattern ST may be at a lower level than those of the second and third isolation patterns ST2 and ST3. In this case, the first isolation pattern ST1 may be formed by a separate process from the second and third isolation patterns ST2 and ST3 but embodiments are not limited thereto.

The active gate structure AGS may be provided on the substrate 100 in the first region R1, and extend in the second direction Y while crossing the first activation pattern AP1. The dummy gate structure DGS may be provided on the substrate 100 in the second region R2, and extend in the second direction Y while crossing the second activation pattern AP2.

The active gate structure AGS may cross the first activation pattern AP1 and cover a top surface and sidewalls of the first activation fin AF1. In some embodiments, the active gate structure AGS may extend in the second direction Y and cross both the nMOSFET region NR and the pMOSFET region PR, but embodiments are not limited thereto. A plurality of active gate structures AGS may be provided. The plurality of active gate structures AGS may be arranged spaced apart from each other in the first direction X.

Each of the plurality of active gate structures AGS may include a gate insulating layer GD, a gate electrode GE, and a gate capping layer GC. The gate insulating layer GD may include, for example, a silicon oxide, a silicon oxynitride, or a high-K dielectric film having a higher dielectric constant than that of the silicon oxide. The gate electrode GE may include, for example, at least one of a conductive metal nitride such as a titanium nitride and a tantalum nitride, and a metal such as aluminum and tungsten. The gate capping layer GC may include, for example, at least one among silicon oxide, silicon nitride, and silicon oxynitride.

Gate spacers SP may be provided on sidewalls of the active gate structure AGS. The gate spacers SP may include at least one among silicon oxide, silicon nitride, and silicon oxynitride. In some embodiments, the gate insulating layer GD may extend between the gate electrode GE and the gate spacer SP.

The first activation fin AF1 located below the active gate structure AGS and overlapping the active gate structure AGS in a plan view may be defined as a channel CH.

The dummy gate structure DGS may extend in the second direction Y and cross the second activation pattern AP2. That is, the dummy gate structure DGS may cover a top surface and sidewalls of the second activation fin AF2. A plurality of dummy gate structures DGS may be provided. The plurality of dummy gate structures DGS may be arranged spaced apart from each other in the first direction X.

The plurality of dummy gate structures DGS may have the same structural features as the active gate structure AGS. For example, each of the plurality of dummy gate structures DGS may include a dummy insulating layer DD, a dummy gate electrode DG, and a dummy capping layer DC, which are sequentially stacked on the substrate 100 in the second region R2. The dummy insulating layer DD may be formed of the same material and in the same manner as the gate insulating layer GD. The dummy gate electrode DG may be formed of the same material and in the same manner as the gate electrode GE. The dummy capping layer DC may be formed of the same material and in the same manner as the gate capping layer GC. The gate spacers SP may be provided on sidewalls of the dummy gate structure DGS.

A source/drain SD may be provided on the first activation patterns AP1 at opposite sides of the active gate structure AGS. In some embodiments, the source/drain SD may be an epitaxial layer grown from the first activation pattern AP1 as a seed as illustrated in the drawings.

In this case, the source/drain SD in the pMOSFET region PR may be configured to apply a compressive strain to the channel CH, and the source/drain SD in the nMOSFET region NR may be configured to apply a tensile strain to the channel CH. In some embodiments, the source/drain SD in the pMOSFET region PR may include silicon germanium (SiGe), and the source/drain SD in the nMOSFET region NR may include silicon (Si) or silicon carbide (SiC).

Unlike that illustrated in the drawings, the source/drain SD may be an impurity region provided in each of the first activation fins AF1 at the opposite sides of the active gate structure AGS. The source/drain SD in the pMOSFET region PR may be a p type impurity region, and the source/drain SD in the nMOSFET region NR may be an n type impurity region. The active gate structure AGS and the source/drain SD may form a transistor in the first region R1.

A lower interlayer insulating film 110 covering the source/drain SD and sidewalls of the gate spacers SP may be provided on the substrate 100. The lower interlayer insulating film 110 may expose the top surfaces of the active gate structure AGS and the dummy gate structure DGS, i.e., top surfaces of the gate capping layer GC and the dummy capping layer DC. For example, a top surface of the lower interlayer insulating film 110 in the first region R1 may be at the same level as the top surface of the active gate structure AGS, and a top surface of the lower interlayer insulating film 110 in the second region R2 may be at the same level as the top surface of the dummy gate structure DGS.

An upper interlayer insulating film 120 covering the top surfaces of the active gate structure AGS and the dummy gate structure DGS may be provided on the lower interlayer insulating film 110. Each of the lower and upper interlayer insulating films 110 and 120 may include at least one of silicon oxide and silicon oxynitride.

A source/drain contact CA passing through the lower interlayer insulating film 110 and electrically connected to the source/drain SD may be provided at the opposite sides of the active gate structure AGS. The source/drain contact CA may be referred to as a first conductive contact C1.

One source/drain contact CA may be connected to one source/drain SD or may be commonly connected to a plurality of sources/drains SD. The source/drain contact CA may be in the form of a bar extending in the second direction Y in a plan view.

The source/drain contact CA may include at least one among a semiconductor material such as doped polysilicon, a metal nitride such as a titanium nitride, a tungsten nitride, and a tantalum nitride, and a metal such as tungsten, titanium, tantalum, and cobalt. Although not shown, a metal silicide may be interposed between each source/drain contact CA and each source/drain SD. The metal silicide may include, for example, at least one among a titanium silicide, a tantalum silicide, and a tungsten silicide.

A gate contact CB electrically connected to the gate electrode GE may be provided on each of the active gate structures AGC. The gate contact CB may be referred to as a first conductive contact C1.

The gate contact CB may pass through the gate capping layer GC and be connected to the gate electrode GE. As illustrated in the drawings, the gate contact CB may be provided on the first isolation pattern ST1 but is not limited thereto. The gate contact CB may include the same material as the source/drain contact CA described above.

In some embodiments, top surfaces of the source/drain contact CA and the gate contact CB may be at substantially the same level as that of the lower interlayer insulating film 110 in the first region R1. A bottom surface of the source/drain contact CA may be at a lower level than that of the gate contact CB.

An etch stop layer ESL may be provided on the lower interlayer insulating film 110, and the upper interlayer insulating film 120 may be provided on the etch stop layer ESL. The upper interlayer insulating film 120 may include a silicon oxide, a silicon oxynitride, a silicon nitride, or a low-K dielectric film having a lower dielectric constant than that of the silicon oxide. The etch stop layer ESL will be described in detail below.

A plurality of merged contacts CM passing through the upper interlayer insulating film 120 and the etch stop layer ESL may be provided in the first region R1. The plurality of merged contacts CM may be referred to as a plurality of second conductive contacts C2. The plurality of merged contacts CM may include at least one among a semiconductor material such as doped polysilicon, a metal nitride such as a titanium nitride, a tungsten nitride, and a tantalum nitride, and a metal such as tungsten, titanium, tantalum, and cobalt.

First and second wires Ma and Mb may be provided on the upper interlayer insulating film 120 in the first region R1. In the drawings, the second wire Mb extending forward/backward in the first direction X (the X-axis direction) and the first wire Ma extending forward/backward in a second direction Y (the Y-axis direction) are indicated by broken lines.

In some embodiments, one first wire Ma may be electrically connected to one source/drain contact CA via the merged contact CM passing through the upper interlayer insulating film 120 and the etch stop layer ESL in the first region R1. One second wire Mb may be electrically connected to one gate contact CB via the merged contact CM passing through the upper interlayer insulating film 120 and the etch stop layer ESL in the first region R1. Accordingly, the first wire Ma may be electrically connected to one source/drain SD via the merged contact CM and the source/drain contact CA, and the second wire Mb may be electrically connected to one gate electrode GE via the merged contact CM and the gate contact CB. The first and second wires Ma and Mb may include a metal material, e.g., aluminum or copper.

In the semiconductor device 10 according to an embodiment of inventive concepts, the resistive structure RS may be provided on the etch stop layer ESL in the second region R2. The resistive structure RS is provided in the upper interlayer insulating film 120 in the second region R2. In some embodiments, the resistive structure RS may have a rectangular planar shape having a long axis in the direction in which the second activation pattern AP2 extends, i.e., the first direction X, but is not limited thereto.

The resistive structure RS may include a resistive pattern RP and an insulation pattern DP. The resistive pattern RP may include a metal or a metal compound. In some embodiments, the resistive pattern RP may include a metal material such as tungsten, titanium, or tantalum. In other embodiments, the resistive pattern RP may include a titanium nitride. In this case, the resistive pattern RP may have a lower specific resistance than that when formed of only a metal and thus may have a small thickness.

The insulation pattern DP may be provided between the resistive pattern RP and the etch stop layer ESL. The insulation pattern DP may have substantially the same planar shape as the resistive pattern RP. The insulation pattern DP may include, for example, a silicon oxide. The insulation pattern DP and the resistive pattern RP, which are sequentially stacked, may be defined as the resistive structure RS. In other embodiments, the insulation pattern DP may be omitted.

The resistive contact CR may be provided in the second region R2. The resistive contact CR may be referred to as a second conductive contact C2.

The resistive contact CR may electrically connect one third wire Mc on the upper interlayer insulating film 120 in the second region R2 and the resistive structure RS. The resistive contact CR may be provided in the upper interlayer insulating film 120 in the second region R2 to be electrically connected to the resistive structure RS. One third wire Mc may be electrically connected to the resistive structure RS via the resistive contact CR. In some embodiments, a plurality of resistive contacts CR may be provided on the resistive structure RS. The plurality of resistive contacts CR on the resistive structure RS may be commonly connected to one third wire Mc. The resistive contact CR may include the same material as the above-described merged contact CM. The third wire Mc may include the same material as the above-described first and second wires Ma and Mb.

In some embodiments, the resistive contact CR may be configured to pass through the resistive pattern RP. That is, the resistive contact CR may reach the insulation pattern DP while passing through the upper interlayer insulating film 120 and the resistive pattern RP. Thus, sidewalls of the resistive contact CR may come into direct contact with the resistive pattern RP. The resistive contact CR may be in the form of a bar extending in the first direction X in a plan view, but is not limited thereto.

In some embodiments, a resistive contact hole CRH in which the resistive contact CR is provided may be formed simultaneously with a plurality of merged contact holes CMH in which the plurality of merged contacts CM are provided. A bottom surface of the resistive contact CR may be at a higher level than those of the plurality of merged contacts CM.

The etch stop layer ESL may be provided on the lower interlayer insulating film 110, and the upper interlayer insulating film 120 may be provided on the etch stop layer ESL. Furthermore, the etch stop layer ESL may be provided between the dummy gate structure DGS and the resistive structure RS in the second region R2

The etch stop layer ESL may have a multilayer structure in which a lower etch stop layer L1, a passivation layer LP, and an upper etch stop layer L2 are sequentially stacked. The lower etch stop layer L1, the passivation layer LP, and the upper etch stop layer L2 may be formed of different materials. In some embodiments, the lower etch stop layer L1 may be formed of, for example, a metal nitride such as an aluminum nitride, the passivation layer LP may be formed of, for example, a silicon oxide, and the upper etch stop layer L2 may be formed of, for example, a silicon nitride.

Generally, in an interconnection including first conductive contacts (a source/drain contact and a gate contact) and second conductive contacts (a merged contact and a resistive contact), top surfaces of the first conductive contacts may be damaged and thus an interface failure may occur when a single-layer etch stop layer is formed below a resistive structure. For example, in a patterning process for forming the second conductive contacts, a top surface of a metal material of the first conductive contacts may be damaged by a dry etching process due to a dispersion of the dry etching process and a dispersion of the thickness of the etch stop layer.

To limit and/or prevent such damage, the semiconductor device 10 according to an embodiment of inventive concepts includes the etch stop layer ESL having a multilayer structure below the resistive structure RS. The upper etch stop layer L2 limits and/or prevents a contact hole from being recessed downward due to over-etching during the dry etching process for forming the plurality of second conductive contacts C2. The upper etch stop layer L2 may also limit and/or prevent the occurrence of a recess phenomenon in a cleaning process performed to remove etch byproducts generated in the dry etching process. The lower etch stop layer L1 may be formed of a material that is easily removable by wet etching, so that a wet etching process may be performed to expose the top surfaces of the plurality of first conductive contacts C1 other than the dry etching process. That is, the wet etching process that causes less damage to the top surface of the plurality of first conductive contacts C1 than the dry etching process may be performed. In addition, the wet etching process may be performed for a shorter time period, if possible, to form the lower etch stop layer L1 as thin as possible while reducing damage to the top surfaces of the plurality of first conductive contacts C1.

Damage to the top surface of the metal material of the plurality of first conductive contacts C1 due to the dry etching process may be limited and/or prevented using such a multistep etching process. The passivation layer LP may protect the lower etch stop layer L1 and limit and/or prevent the occurrence of a side effect that oxidizes the lower etch stop layer L1 and thus strengthens resistance to wet etching. The passivation layer LP may be removed together with the upper etch stop layer L2 by the dry etching process.

Accordingly, in the semiconductor device 10 according to an embodiment of inventive concepts, the occurrence of an interface failure between the plurality of first conductive contacts C1 and the plurality of second conductive contacts C2 may be limited and/or prevented by forming the etch stop layer ESL having the multilayer structure below the resistive structure RS, thereby improving electrical characteristics and production efficiency.

Figure 3:
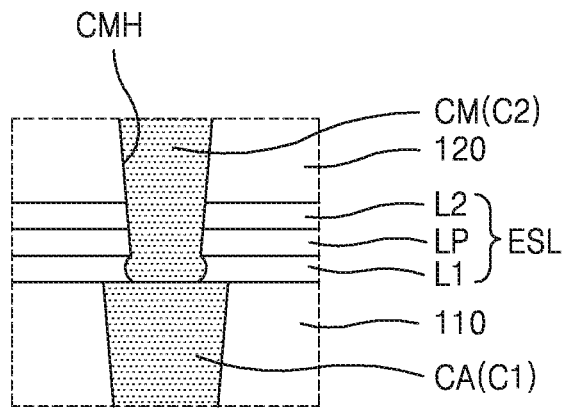
FIG. 3 is an enlarged view of a region III of FIG. 2A.

FIG. 3 is an enlarged view of a region III of FIG. 2A.

Referring to FIG. 3, sidewalls of the second conductive contact C2, which are in contact with the lower etch stop layer L1, may have a convex shape, and sidewalls of the second conductive contact C2, which are in contact with the passivation layer LP and the upper etch stop layer L2, may have a tapered shape.

In the semiconductor device 10 according to an embodiment of inventive concepts, the material of the lower etch stop layer L1 may have wet etch selectivity with respect to that of the plurality of first conductive contacts C1, and the material of the upper etch stop layer L2 may have dry etch selectivity with respect to that of the lower etch stop layer L1. The material of the passivation layer LP may limit and/or prevent oxidization of the lower etch stop layer L1.

The lower etch stop layer L1 may be formed of, for example, a metal nitride such as an aluminum nitride, the passivation layer LP may be formed of, for example, a silicon oxide, and the upper etch stop layer L2 may be formed of, for example, a silicon nitride. That is, in order to satisfy different etch selectivities, the lower etch stop layer L1, the passivation layer LP, and the upper etch stop layer L2 of the etch stop layer ESL may be formed of different materials.

As will be described below, the passivation layer LP and the upper etch stop layer L2 are patterned by dry etching, which is anisotropic etching, and thus the side walls of the second conductive contact C2, which are in contact with the passivation layer LP and the upper etch stop layer L2, may have a tapered shape. In contrast, the lower etch stop layer L1 is patterned by wet etching, which is isotropic etching, and thus the sidewalls of the second conductive contact C2, which are in contact with the lower etch stop layer L1, may have a convex shape.

Figure 4:
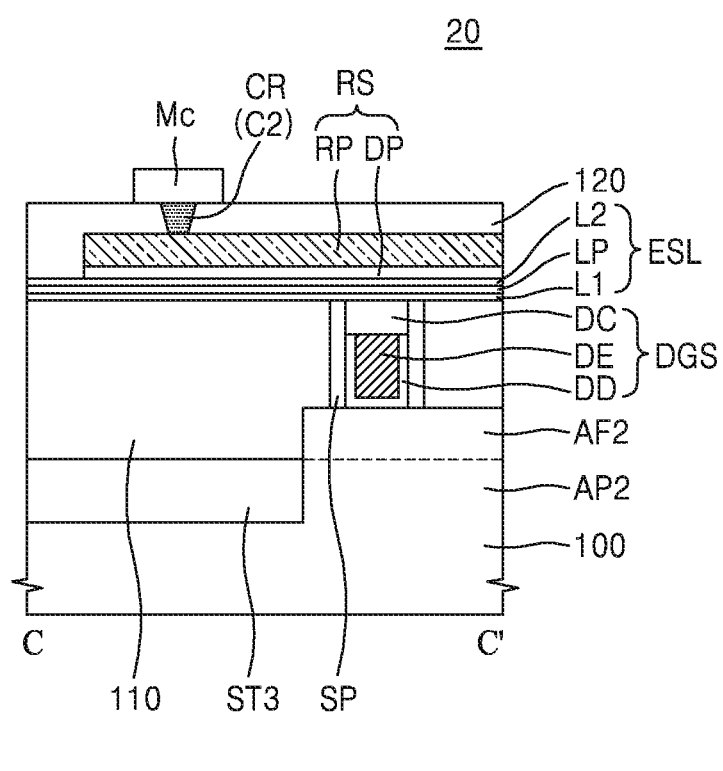
FIG. 4 is a cross-sectional view taken along line C-C' of FIG. 1 for explaining a modified example of a second conductive contact.

FIG. 4 is a cross-sectional view taken along line C-C' of FIG. 1 for explaining a modified example of a second conductive contact.

Referring to FIG. 4, in a semiconductor device 20 according to another embodiment of inventive concepts, a bottom surface of a resistive contact CR, which is in contact with a resistive structure RS, may be formed to be in contact with a top surface of a resistive pattern RP.

Components of the semiconductor device 20 and materials thereof are substantially the same as those described above with reference to FIGS. 1 to 2D and thus will be described focusing on the differences from those of FIGS. 1 to 2D below.

The resistive contact CR may be configured to be in contact with the resistive pattern RP while not passing through the resistive structure RS. That is, the resistive contact CR may pass through an upper interlayer insulating film 120 and then reach the resistive pattern RP. Accordingly, sidewalls of the resistive contact CR may come into direct contact with the upper interlayer insulating film 120, and a bottom surface thereof may come into direct contact with a top surface of the resistive pattern RP.

Figure 5:
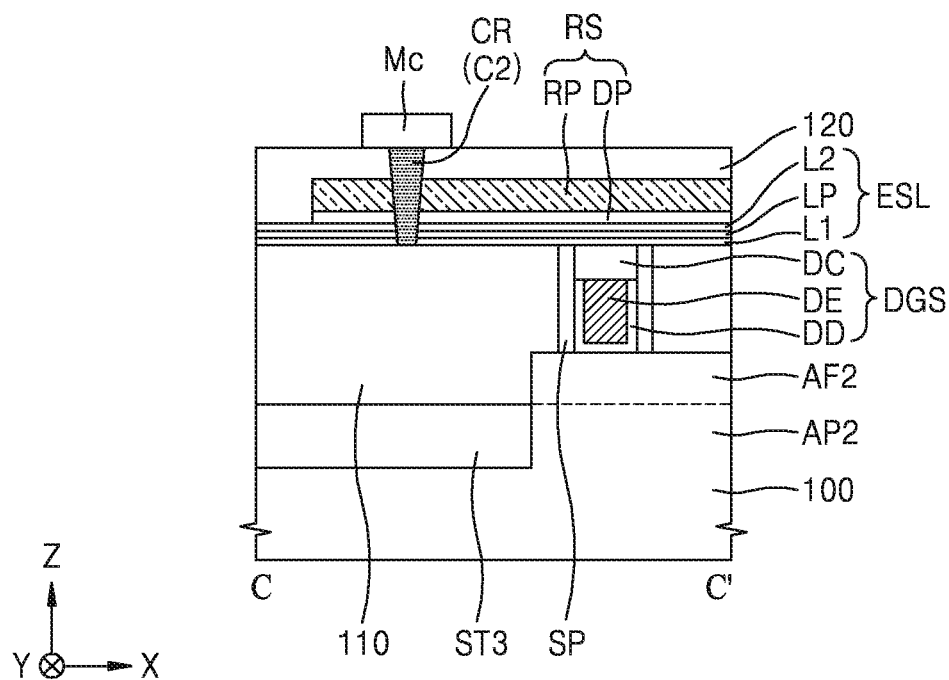
FIG. 5 is a cross-sectional view taken along line C-C' of FIG. 1 for explaining another modified example of a second conductive contact.

FIG. 5 is a cross-sectional view taken along line C-C' of FIG. 1 for explaining another modified example of a second conductive contact.

Referring to FIG. 5, in a semiconductor device 30 according to another embodiment of inventive concepts, a bottom surface of a resistive contact CR, which is in contact with a resistive structure RS, may be formed to be in contact with a top surface of a lower interlayer insulating film 110.

Components of the semiconductor device 30 and materials thereof are substantially the same as those described above with reference to FIGS. 1 to 2D and thus will be described focusing on the differences from those of FIGS. 1 to 2D below.

The resistive contact CR may be configured to pass through the resistive structure RS. That is, the resistive contact CR may pass through the upper interlayer insulating film 120, the resistive structure RS, and an etch stop layer ESL and then reach a lower interlayer insulating film 110.

Thus, sidewalls of the resistive contact CR may come into direct contact with an upper interlayer insulating film 120, the resistive structure RS, and the etch stop layer ESL, and a bottom surface thereof may come into direct contact with a top surface of the lower interlayer insulating film 110. Accordingly, the bottom surface of the merged contact CM (see FIG. 2A) may be at substantially the same level as a bottom surface of the resistive contact CR.

Figure 6:
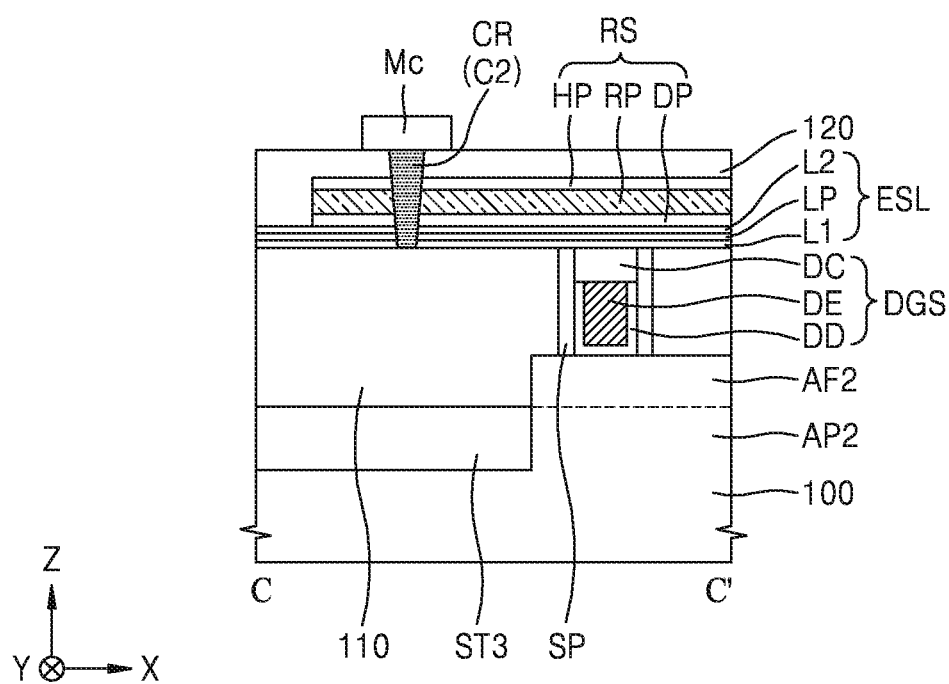
FIG. 6 is a cross-sectional view taken along line C-C' of FIG. 1 for explaining a modified example of a resistive structure.

FIG. 6 is a cross-sectional view taken along line C-C' of FIG. 1 for explaining a modified example of a resistive structure.

Referring to FIG. 6, in a semiconductor device 40 according to another embodiment of inventive concepts, a hard mask pattern HP may be provided on a resistive pattern RP.

Components of the semiconductor device 40 and materials thereof are substantially the same as those described above with reference to FIGS. 1 to 2D and thus will be described focusing on the differences from those of FIGS. 1 to 2D below.

A resistive structure RS may include an insulation pattern DP, the resistive pattern RP, and the hard mask pattern HP, which are sequentially stacked. The insulation pattern DP and the hard mask pattern HP may have substantially the same planar shape as the resistive pattern RP. That is, side surfaces of the insulation pattern DP, sidewalls of the resistive pattern RP, and sidewalls of the hard mask pattern HP may be aligned in the third direction Z perpendicular to a top surface of a substrate 100. The hard mask pattern HP may include, for example, a silicon nitride film or a silicon oxynitride film.

A resistive contact CR may be configured to pass through the resistive structure RS. That is, the resistive contact CR may pass through an upper interlayer insulating film 120, a resistive structure RS, and an etch stop layer ESL and then reach a lower interlayer insulating film 110. Thus, sidewalls of the resistive contact CR may come into direct contact with the upper interlayer insulating film 120, the resistive structure RS, and the etch stop layer ESL, and a bottom surface thereof may come into direct contact with a top surface of the lower interlayer insulating film 110. Accordingly, a bottom surface of the merged contact CM (see FIG. 2A) may be substantially at the same level as that of the resistive contact CR.

Figure 7A:
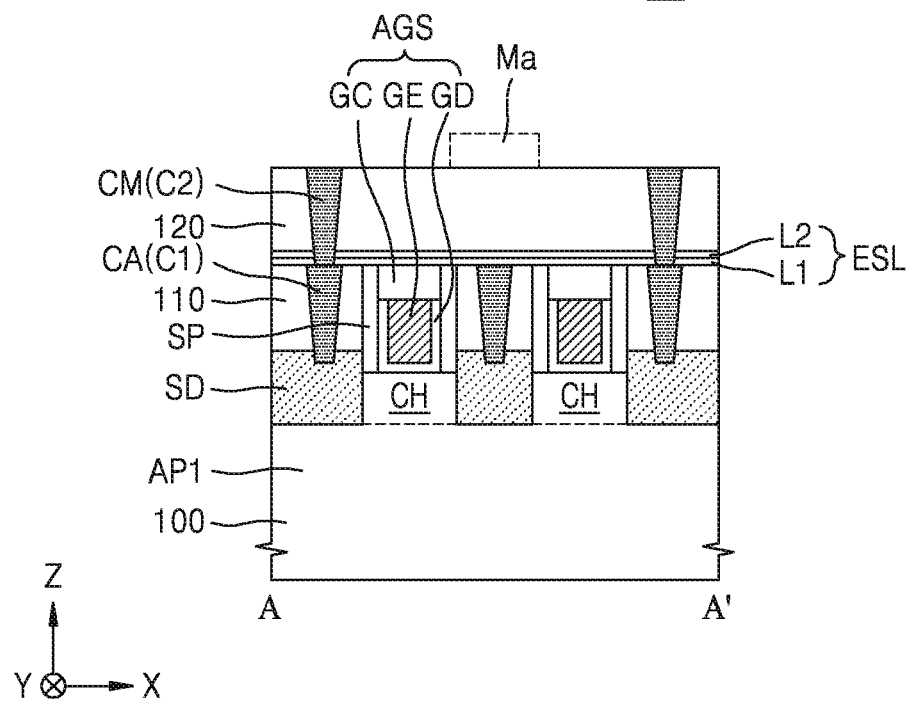
Figure 7B:
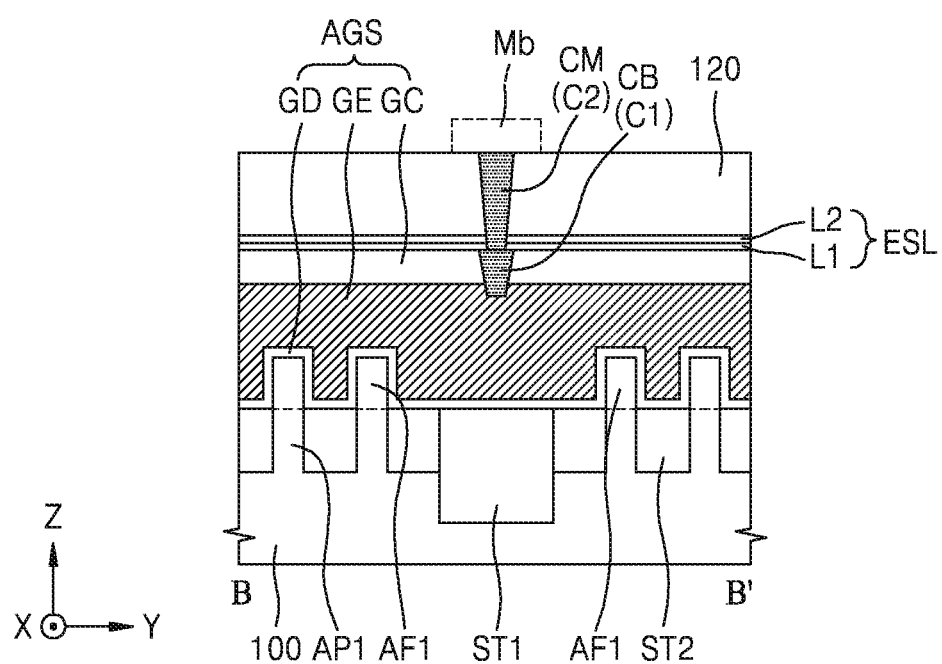
Figure 7C:
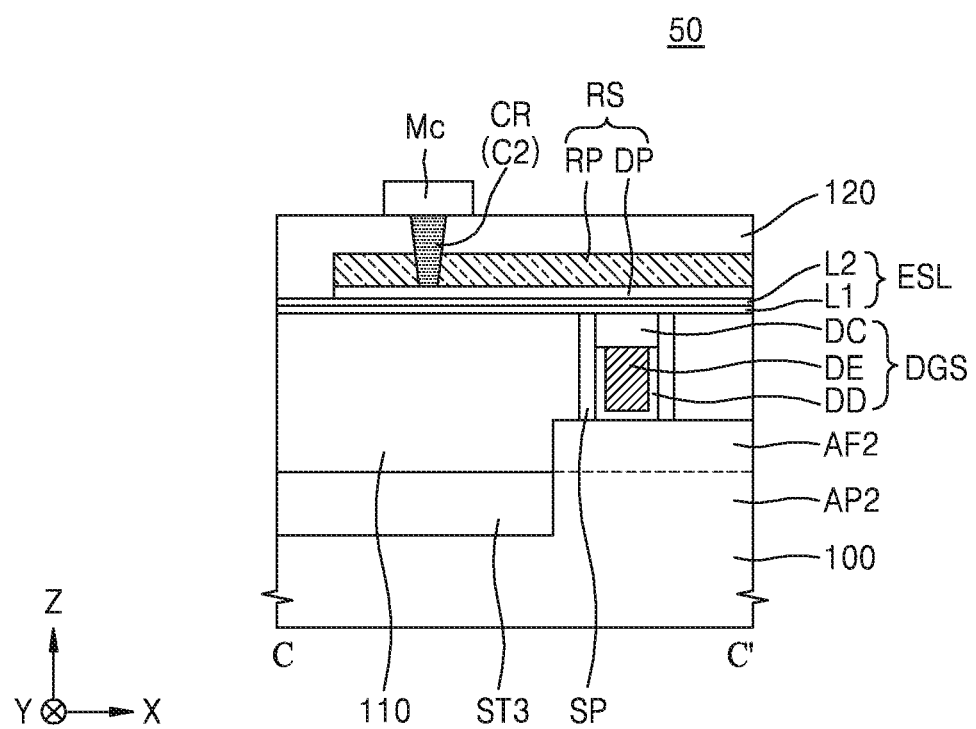

FIGS. 7A to 7C are diagrams illustrating a modified example of an etch stop layer. FIG. 7A is a cross-sectional view taken along line A-A' of FIG. 1. FIG. 7B is a cross-sectional view taken along line B-B' of FIG. 1. FIG. 7C is a cross-sectional view taken along line C-C' of FIG. 1.

Referring to FIGS. 7A to 7C, in a semiconductor device 50 according to another embodiment of inventive concepts, an etch stop layer ESL may have a multilayer structure in which a lower etch stop layer L1 and an upper etch stop layer L2 are sequentially stacked.

Components of the semiconductor device 50 and materials thereof are substantially the same as those described above with reference to FIGS. 1 to 2D and thus will be described focusing on the differences from those of FIGS. 1 to 2D below.

The etch stop layer ESL may not include a passivation layer which limits and/or prevents oxidization of a lower etch stop layer L1, and may have a multilayer structure in which the upper etch stop layer L2 is formed directly on the lower etch stop layer L1.

The lower etch stop layer L1 and the upper etch stop layer L2 may be formed of different materials. The lower etch stop layer L1 may be formed of, for example, a metal nitride such as an aluminum nitride, and the upper etch stop layer L2 may be formed of, for example, a silicon nitride.

Figure 8:
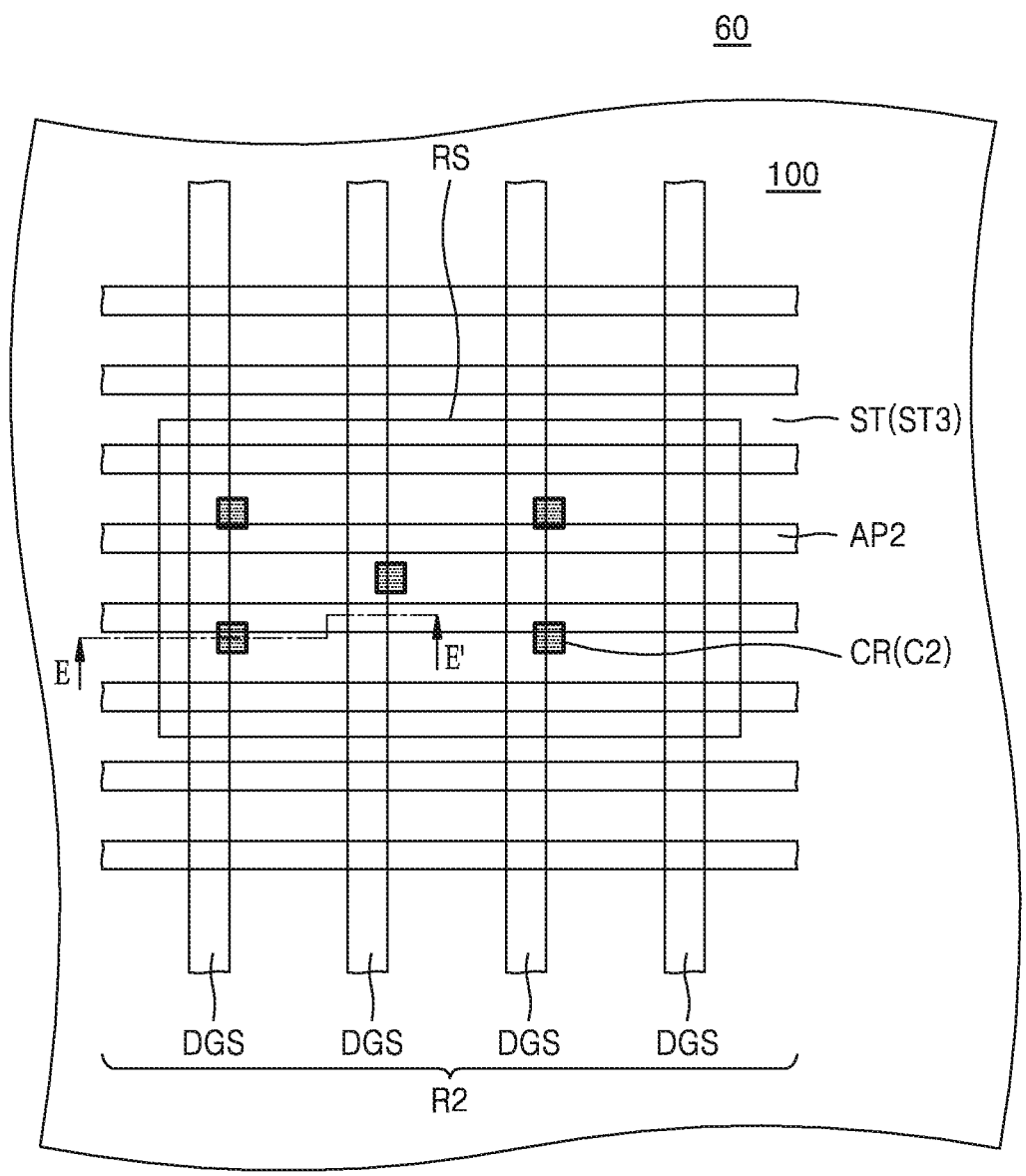
FIG. 8 is a plan view corresponding to a second region of FIG. 1.
Figure 9:
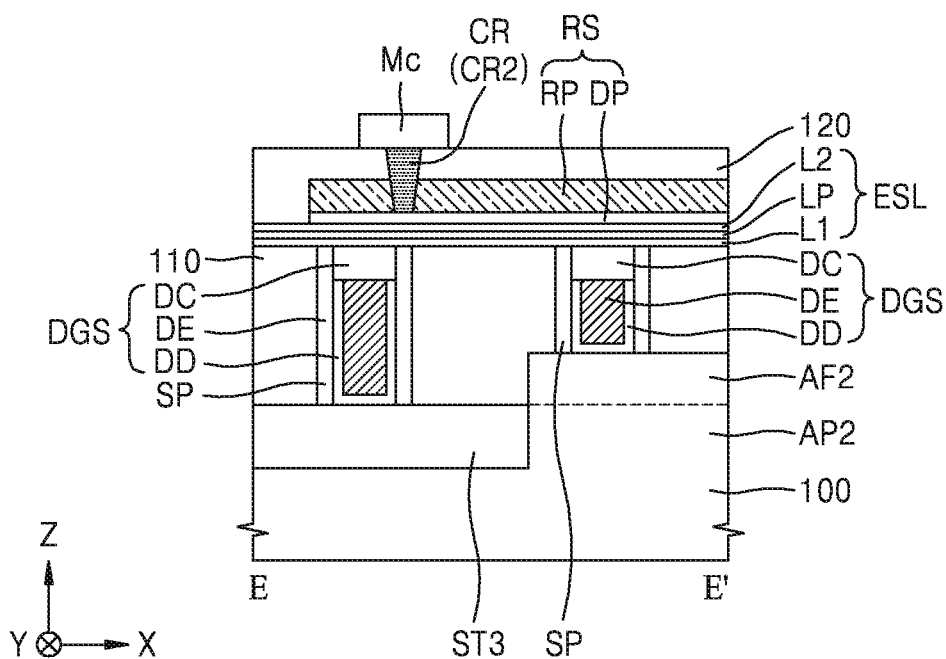
FIG. 9 is a cross-sectional view taken along line E-E' of FIG. 8.

FIG. 8 is a plan view corresponding to the second region R2 of FIG. 1. FIG. 9 is a cross-sectional view taken along line E-E' of FIG. 8.

Referring to FIGS. 8 and 9, in a semiconductor device 60 according to another embodiment of inventive concepts, a dummy gate structure DGS may be provided below a resistive contact CR.

Components of the semiconductor device 60 and materials thereof are substantially the same as those described above with reference to FIGS. 1 to 2D and thus will be described focusing on the differences from those of FIGS. 1 to 2D below.

A dummy gate structure DGS in a second region R2 may be provided to reduce a step between the first region R1 (see FIG. 1) and the second region R2, caused due to a pattern density difference. The dummy gate structure DGS is not an element of a transistor unlike the active gate structure AGS (see FIG. 1) in the first region R1 (see FIG. 1) and thus does not have an influence on the characteristics of the semiconductor device 60 even when the resistive contact CR is not located on the dummy gate structure DGS. Thus, the dummy gate structure DGS may be provided below the resistive contact CR according to a layout of the design of the semiconductor device 60 according to the other embodiment of inventive concepts.

Figure 10A:
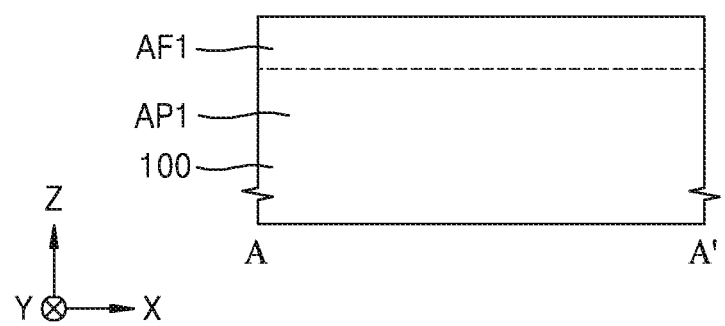
FIGS. 10A to 19C are diagrams illustrating, in a process sequence, a method of fabricating a semiconductor device according to an embodiment of inventive concepts, in which FIGS. 10A, 11A, . . . , and 19A are cross-sectional views taken along line A-A' of FIG. 1, FIGS. 10B, 11B, . . . , and 19B are cross-sectional views taken along line B-B' of FIG. 1, and FIGS. 10C, 11C, . . . , and 19C are cross-sectional views taken along line C-C' of FIG. 1.

FIGS. 10A to 19C are diagrams illustrating a method of fabricating a semiconductor device according to an embodiment of inventive concepts in a process sequence. FIGS. 10A, 11A, . . . , and 19A are cross-sectional views taken along line A-A' of FIG. 1. FIGS. 10B, 11B, . . . , and 19B are cross-sectional views taken along line B-B' of FIG. 1. FIGS. 10C, 11C, . . . , and 19C are cross-sectional views taken along line C-C' of FIG. 1.

Figure 10B:
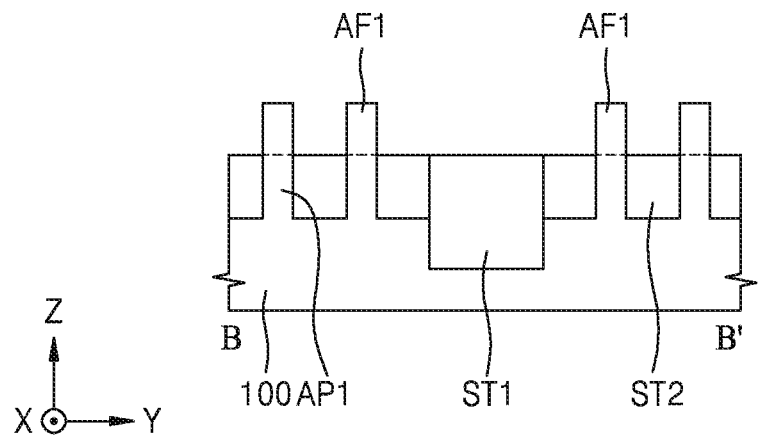
Figure 10C:
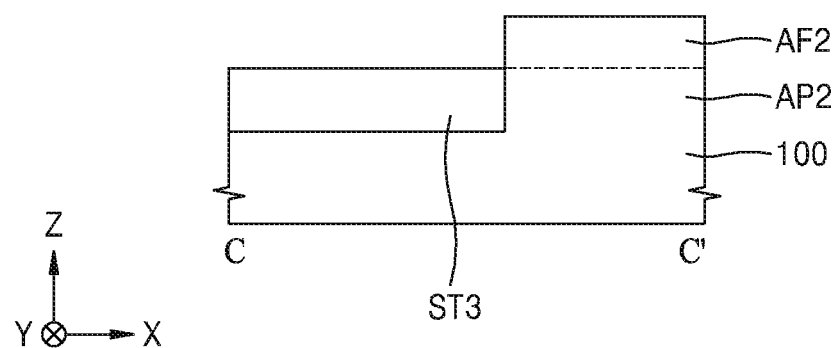

Referring to FIGS. 10A to 10C, a substrate 100 including a first region R1 and a second region R2 is provided. The substrate 100 may include a semiconductor substrate. The first region R1 may be part of a logic cell region or part of a memory cell region. The second region R2 may be a region in which a resistive element is formed. That is, the second region R2 may be a resistive region included in an integrated circuit of a semiconductor device.

First activation patterns AP1 may be formed on the substrate 100 in the first region R1, and second activation patterns AP2 may be formed on the substrate 100 in the second region R2. Each of the first and second activation patterns AP1 and AP2 may be in the form of a line arranged in a second direction Y and extending in a first direction X. In some embodiments, the first and second activation patterns AP1 and AP2 may be formed by patterning an upper portion of the substrate 100. In other embodiments, the first and second activation patterns AP1 and AP2 may be formed by forming an epitaxial layer on the substrate 100 and patterning the epitaxial layer. Each of the first and second activation patterns AP1 and AP2 may be in the form of a fin protruding in a third direction Z perpendicular to a top surface of the substrate 100.

The first and second isolation patterns ST1 and ST2 may be formed on the substrate 100 in the first region R1. The first isolation pattern ST1 may divide a pMOSFET region and an nMOSFET region in the second direction Y. The second isolation pattern ST2 may expose an upper portion of the first activation pattern AP1. The exposed upper portion of the first activation pattern AP1 may be defined as a first activation fin AF1. A third isolation pattern ST3 may be formed on the substrate 100 in the second region R2. The third isolation pattern ST3 may expose an upper portion of the second activation pattern AP2. The exposed upper portion of the second activation pattern AP2 may be defined as a second activation fin AF2.

The first isolation pattern ST1 may be formed to be thicker than the second and third isolation patterns ST2 and ST3. In this case, the first isolation pattern ST1 may be formed by a separate process from the second and third isolation patterns ST2 and ST3. The separate process may include removing part of a dummy activation pattern between the pMOSFET region and the nMOSFET region, i.e., part of the first activation pattern AP1, and filling an insulating film in a trench formed by the removing of the dummy activation pattern.

Unlike that illustrated in the drawings, the second activation pattern AP2 may be removed. For example, the removing of the second activation pattern AP2 may be performed simultaneously with the removing of the dummy activation pattern. In this case, the third isolation pattern ST3 may be formed to have substantially the same thickness as the first isolation pattern ST1 and have a thickness greater than that of the second isolation pattern ST2.

Figure 11A:
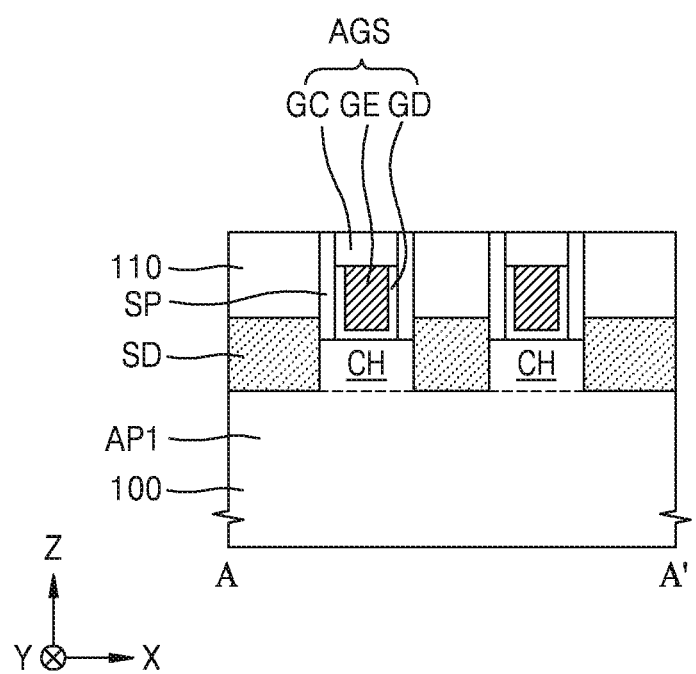
Figure 11B:
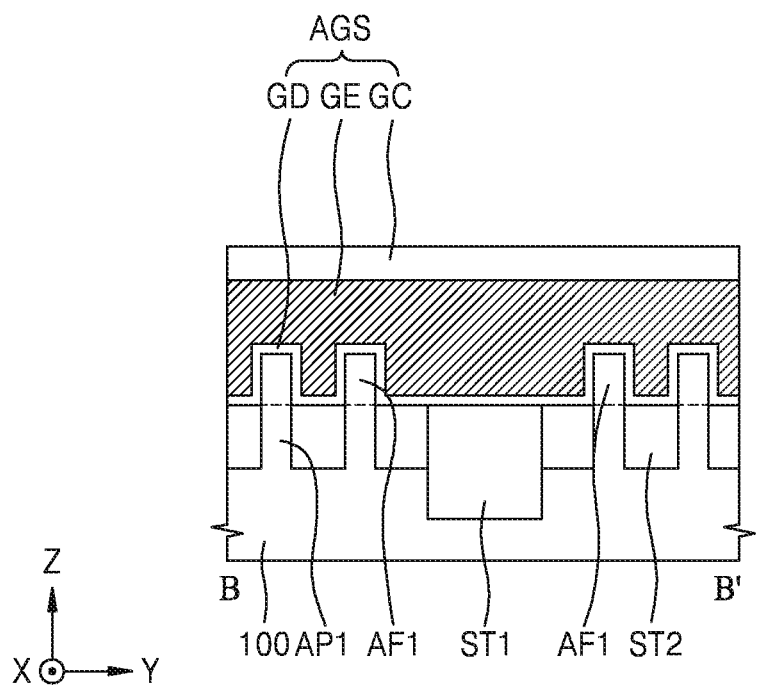
Figure 11C:
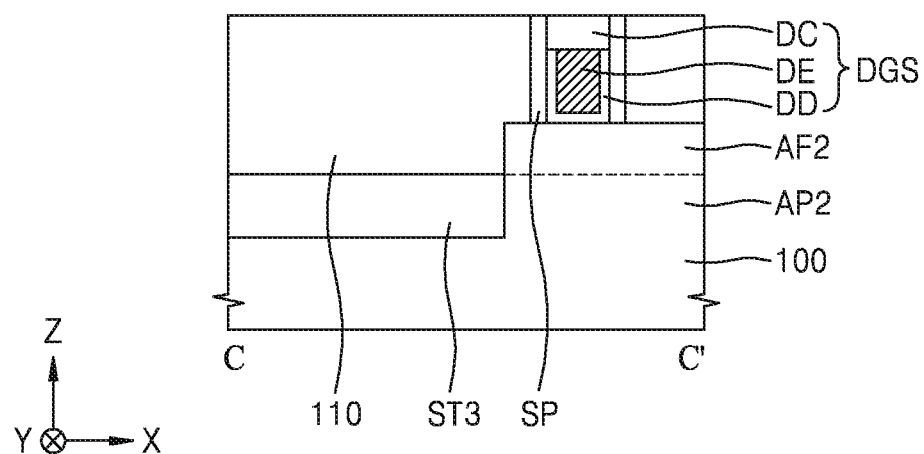

Referring to FIGS. 11A to 11C, active gate structures AGS crossing the first activation pattern AP1 and extending in the second direction Y may be formed on the substrate 100 in the first region R1, and dummy gate structures DGS crossing the second activation pattern AP2 and extending in the second direction Y may be formed on the substrate 100 in the second region R2.

Each of the active gate structures AGS may include a gate insulating layer GD, a gate electrode GE, and a gate capping layer GC.

In some embodiments, the active gate structures AGS may be formed by a gate-last process using a sacrificial gate structure (not shown). For example, the forming of the active gate structures AGS may include forming a sacrificial gate structure crossing the first activation pattern AP1, forming gate spacers SP on opposite sidewalls of the sacrificial gate structure, removing the sacrificial gate structure to define a gate region exposing the first activation pattern AP1 between the gate spacers SP, and sequentially forming the gate insulating layer GD, the gate electrode GE, and the gate capping layer GC in the gate region.

The dummy gate structures DGS may be formed in the substantially the same manner and of the same material as the active gate structures AGS. Thus, the dummy gate structures DGS may have the same structural features as the active gate structures AGS. For example, each of the dummy gate structures DGS may include a dummy insulating layer DD, a dummy gate electrode DG, and a dummy capping layer DC. The number of dummy gate structures DGS, the length thereof, and/or a region in which the dummy gate structures DGS are arranged may be determined considering a resistive structure RS to be formed.

A source/drain SD may be formed on the first activation patterns AP1 at opposite sides of the active gate structure AGS. In some embodiments, the source/drain SD may be formed to apply strain to a channel CH below the active gate structure AGS. The forming of the source/drain SD may include removing the first activation fins AF1 at the opposite sides of the gate spacers SP and performing a selective epitaxial growth process using, as a seed, the first activation patterns AP1, the upper portions of which are removed.

In some embodiments, the source/drain SD in the pMOSFET region may be formed of silicon germanium (SiGe), and the source/drain SD in the nMOSFET region may be formed of silicon carbide (SiC). The source/drain SD may be doped with impurities simultaneously with or after the epitaxial growth process. The source/drain SD in the pMOSFET region may be doped with p type impurities, and the source/drain SD in the nMOSFET region may be doped with n type impurities.

A lower interlayer insulating film 110 covering the source/drain SD and sidewalls of the gate spacers SP may be formed on the substrate 100. The lower interlayer insulating film 110 in the first region R1 may be formed to expose a top surface of the active gate structure AGS, and the lower interlayer insulating film 110 in the second region R2 may be formed to expose a top surface of the dummy gate structure DGS.

For example, a top surface of the lower interlayer insulating film 110 in the first region R1 may be at substantially the same level as that of the active gate structure AGS, and the lower interlayer insulating film 110 in the second region R2 may be at substantially the same level as that of the dummy gate structure DGS.

Figure 12A:
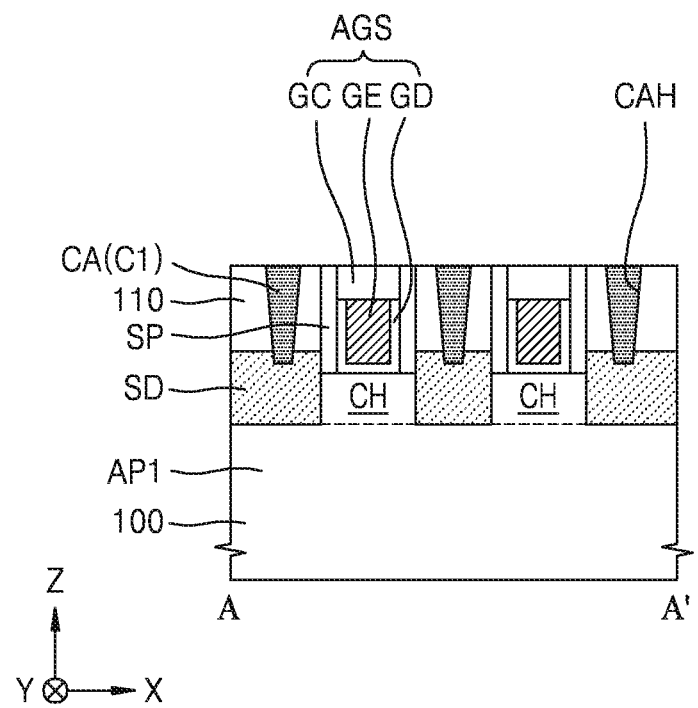
Figure 12B:
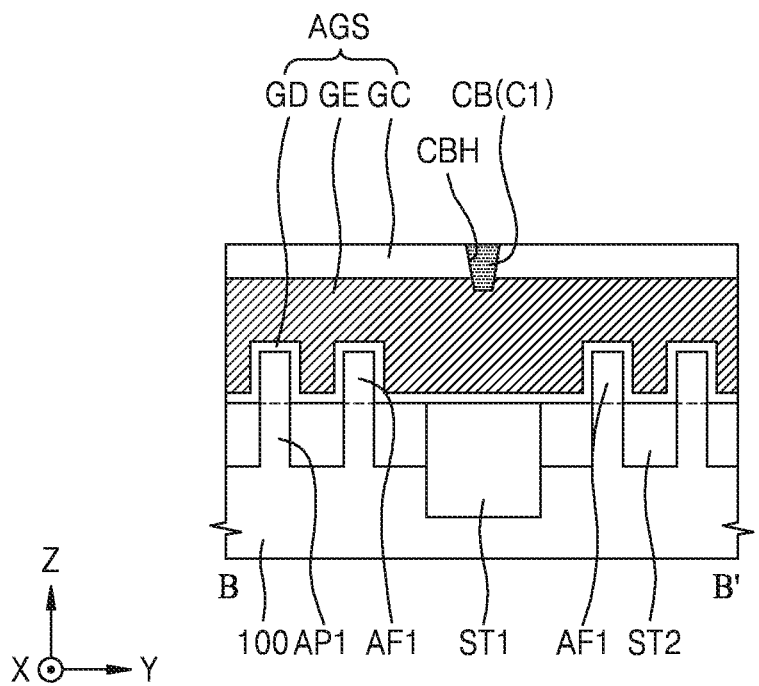
Figure 12C:
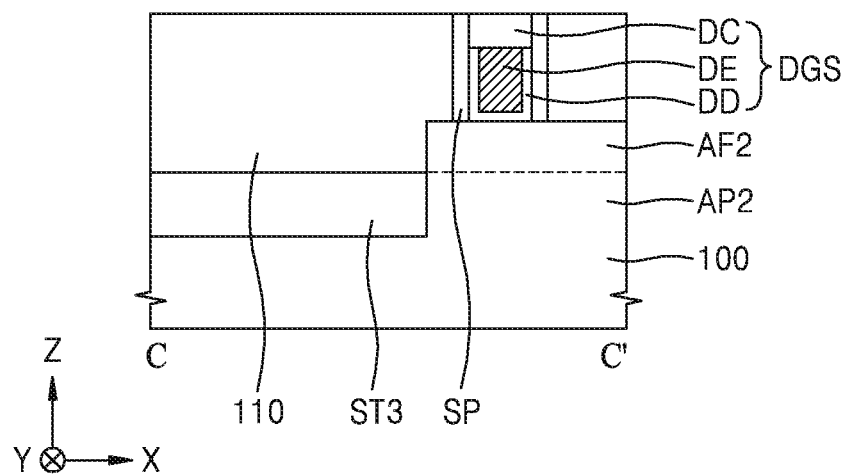

Referring to FIGS. 12A to 12C, a source/drain contact hole CAH passing through the lower interlayer insulating film 110 and exposing the source/drain SD and a gate contact hole CBH passing through the gate capping layer GC and exposing the gate electrode GE may be formed in the first region R1.

The source/drain contact hole CAH and the gate contact hole CBH may be formed by separate patterning processes. For example, the source/drain contact hole CAH may be formed by a first patterning process and then a gate contact hole CBH may be formed by a second patterning process, and vice versa. The source/drain contact hole CAH may be formed to be deeper than the gate contact hole CBH. Each of the first and second patterning processes may include forming a mask pattern on the lower interlayer insulating film 110 and performing an anisotropic etching process using the mask pattern as an etch mask.

A source/drain contact CA may be formed in the source/drain contact hole CAH, and a gate contact CB may be formed in the gate contact hole CBH. In detail, the forming of the source/drain contact CA and the gate contact CB may include filling the insides of the source/drain contact hole CAH and the gate contact hole CBH with a conductive material and planarizing the conductive material so that the top surface of the lower interlayer insulating film 110 is exposed. Accordingly, top surfaces of the source/drain contact CA and the gate contact CB may be at substantially the same level as that of the lower interlayer insulating film 110. The conductive material may include at least one among a doped semiconductor material, a metal nitride, and a metal.

Figure 13A:
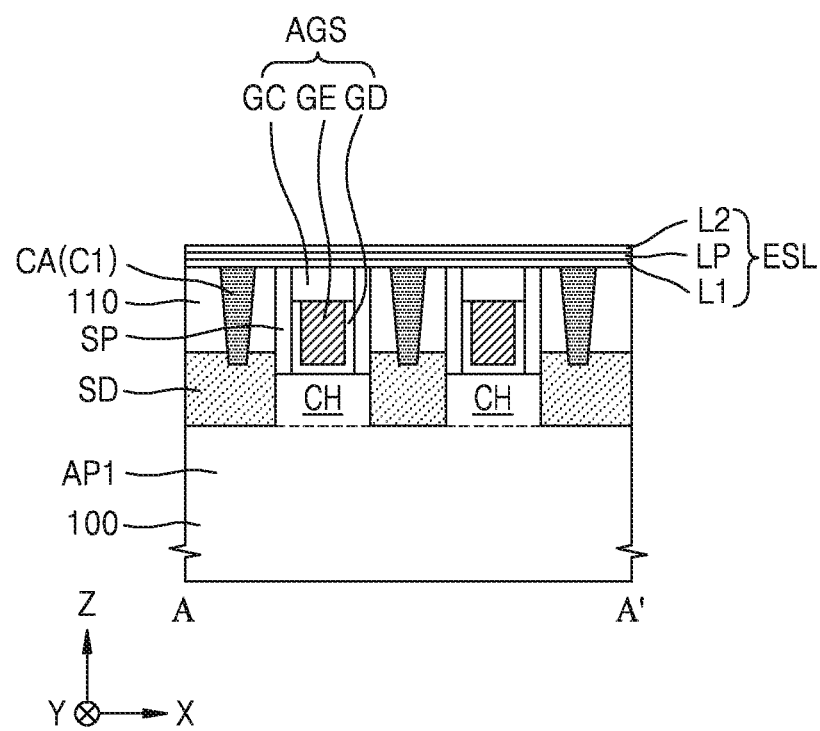
Figure 13B:
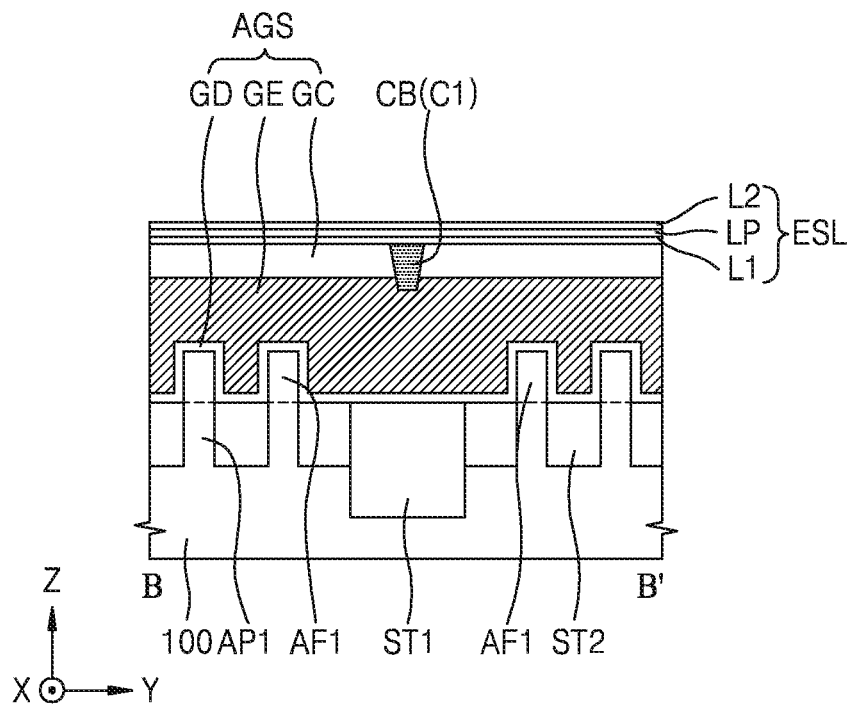
Figure 13C:
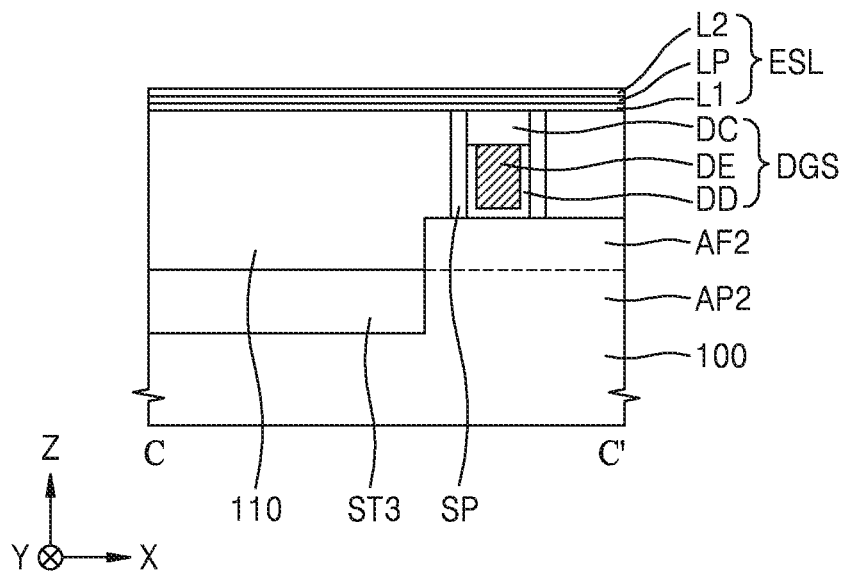

Referring to FIGS. 13A to 13C, an etch stop layer ESL may be formed on the lower interlayer insulating film 110 in the first region R1 and the second region R2.

The etch stop layer ESL may be formed such that a lower etch stop layer L1, a passivation layer LP, and an upper etch stop layer L2 are sequentially stacked. The etch stop layer ESL may be formed of an insulating material. The lower etch stop layer L1, the passivation layer LP, and the upper etch stop layer L2 may be formed of different materials.

In some embodiments, the lower etch stop layer L1 may be formed of, for example, a metal nitride such as an aluminum nitride, the passivation layer LP may be formed of, for example, a silicon oxide, and the upper etch stop layer L2 may be formed of, for example, a silicon nitride.

Figure 14A:
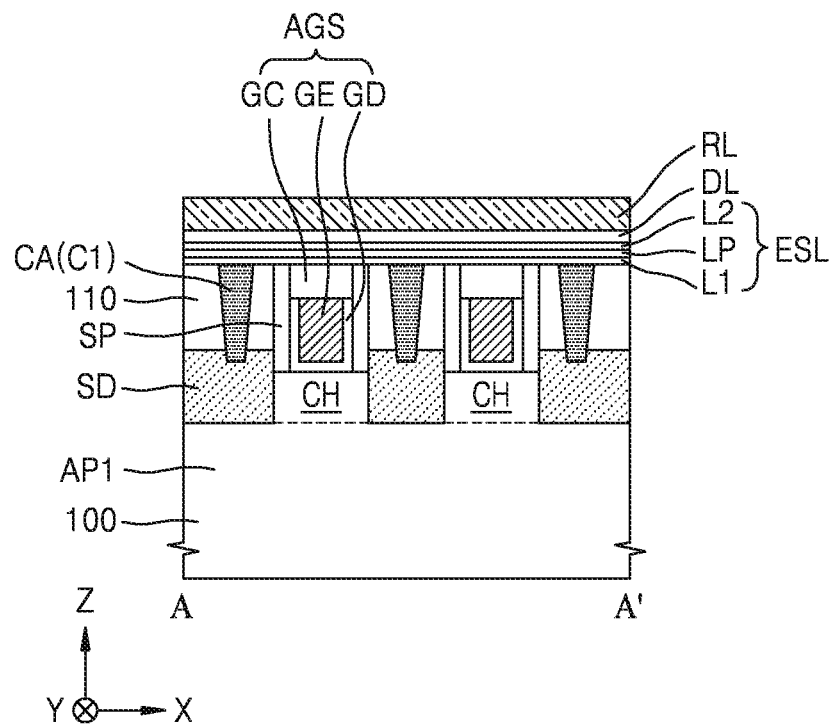
Figure 14B:
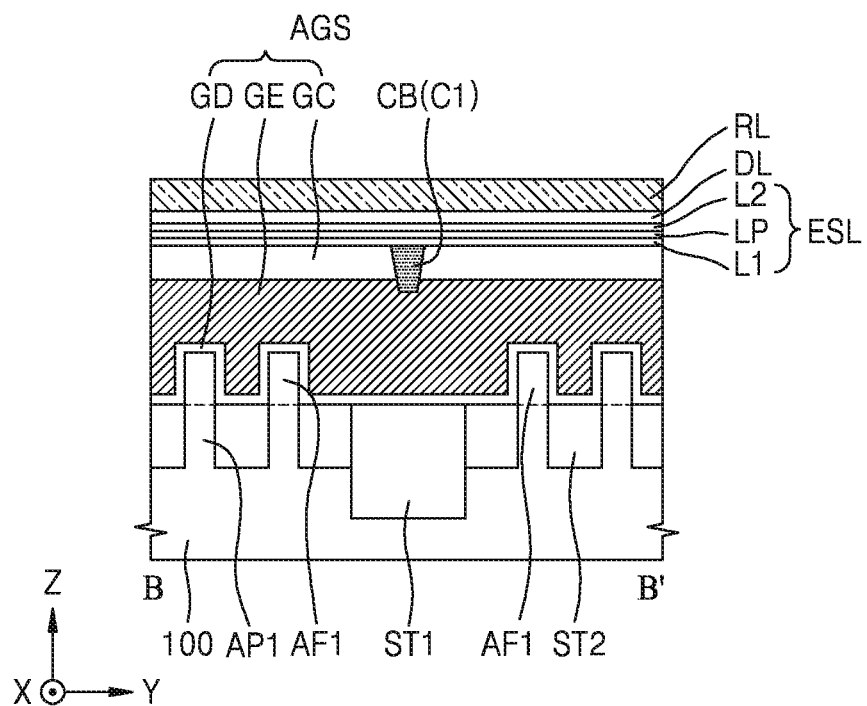
Figure 14C:
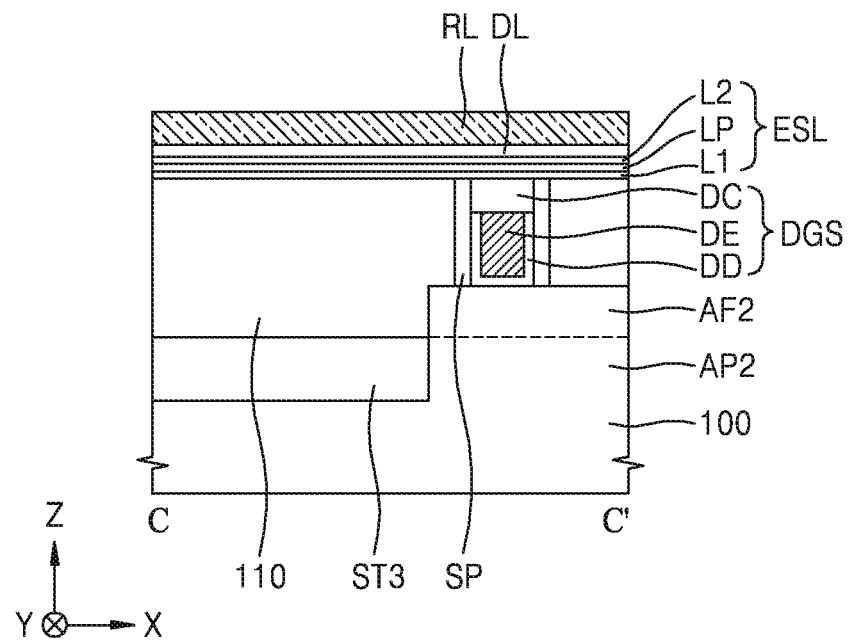

Referring to FIGS. 14A to 14C, a preliminary insulating layer DL and a preliminary resistive element layer RL may be sequentially stacked on the etch stop layer ESL in the first region R1 and the second region R2. For example, the preliminary insulating layer DL may include a silicon oxide, and the preliminary resistive element layer RL may include a metal or a metal compound. In detail, the preliminary resistive element layer RL may include tungsten, titanium, tantalum, or a compound thereof. In some embodiments, the preliminary resistive element layer RL may include a titanium nitride. In this case, the preliminary resistive element layer RL may have a low specific resistance and thus may be formed to a relatively small thickness. For example, the preliminary resistive element layer RL may be formed to a thickness of about 50 Å.

Figure 15A:
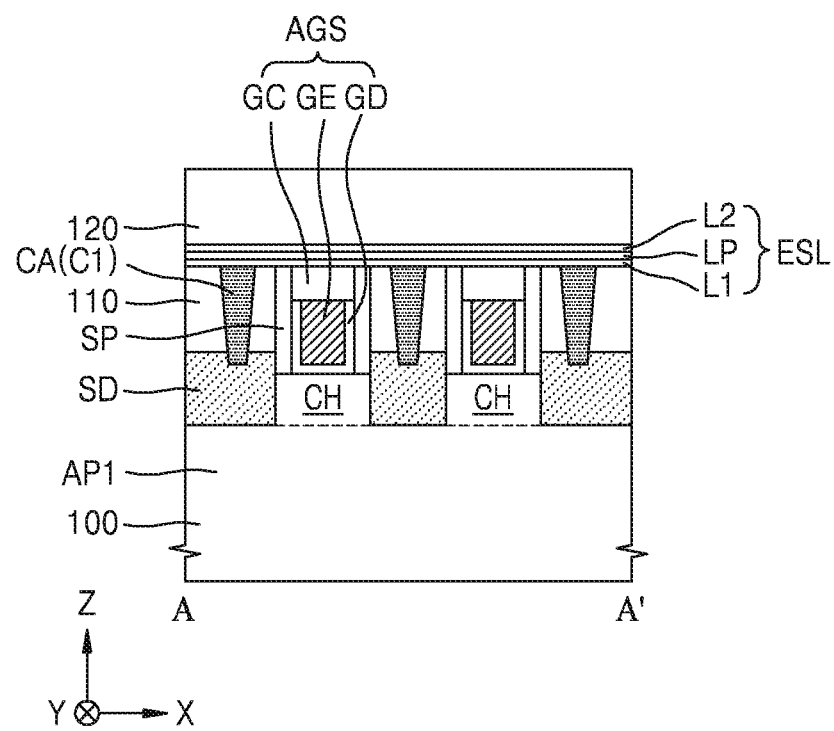
Figure 15B:
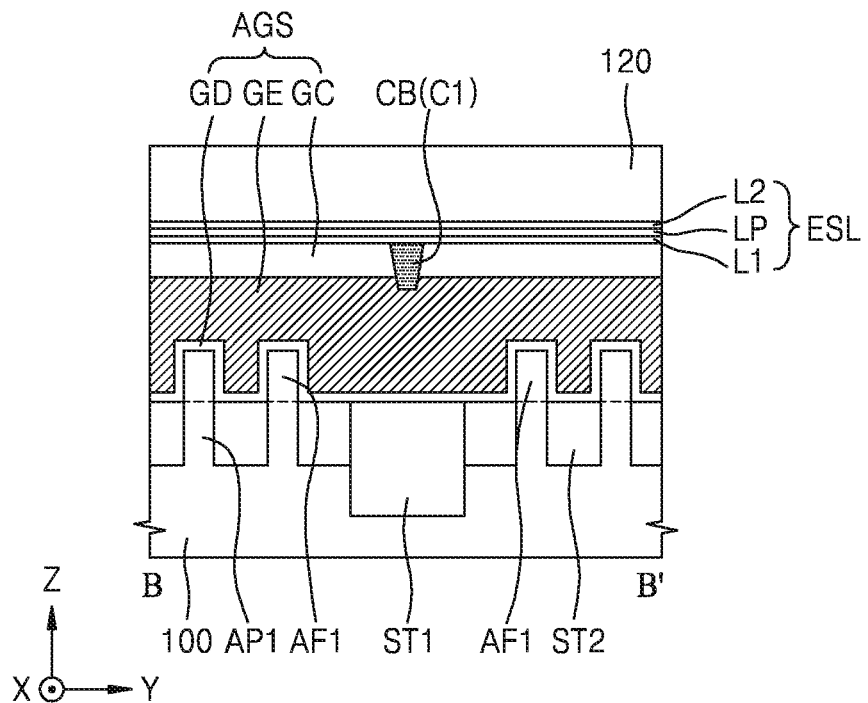
Figure 15C:
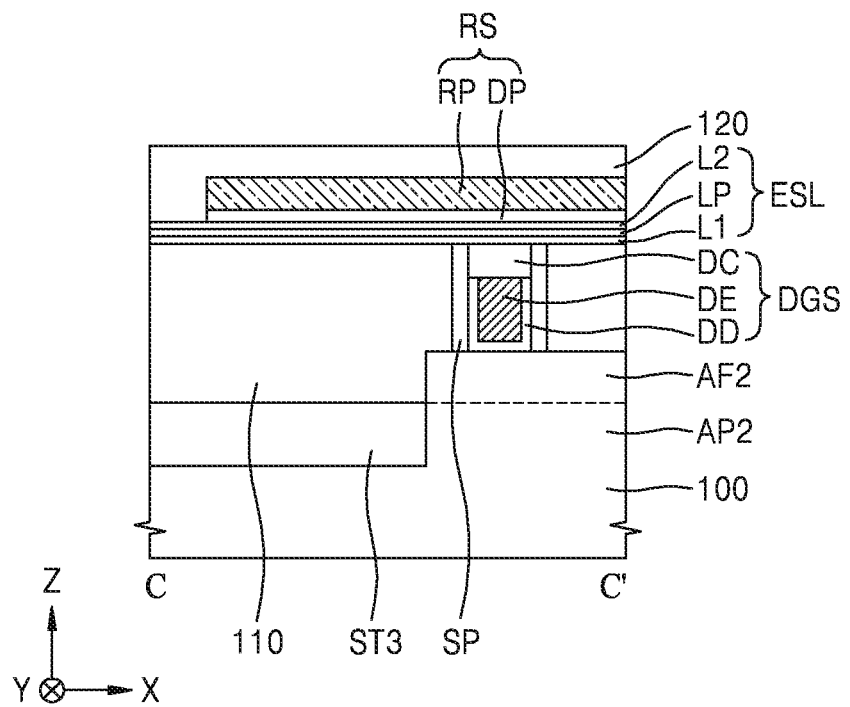

Referring to FIGS. 15A to 15C, the resistive structure RS may be formed on the etch stop layer ESL in the second region R2. The resistive structure RS may include an insulation pattern DP formed by patterning the preliminary insulating layer DL (see FIG. 14C), and a resistive pattern RP formed by patterning the preliminary resistive element layer RL (see FIG. 14C). The resistive structure RS may be formed in a flat panel shape but is not limited thereto.

An upper interlayer insulating film 120 may be formed on the etch stop layer ESL. The upper interlayer insulating film 120 in the first region R1 may cover a top surface of the etch stop layer ESL, and the upper interlayer insulating film 120 in the second region R2 may cover the etch stop layer ESL and the resistive structure RS. In some embodiments, a process of planarizing a top surface of the upper interlayer insulating film 120 may be performed after the forming of the upper interlayer insulating film 120. The planarization process may be performed to remove a step between the upper interlayer insulating film 120 in the first region R1 and the upper interlayer insulating film 120 in the second region R2, caused by the resistive structure RS.

In other embodiments, the planarization process may be skipped. Even if the planarization process is skipped, the step between the upper interlayer insulating film 120 in the first region R1 and the upper interlayer insulating film 120 in the second region R2 falls within a process dispersion range when the resistive pattern RP is formed of a material having a low specific resistance such as a titanium nitride and thus has a small thickness.

Figure 16A:
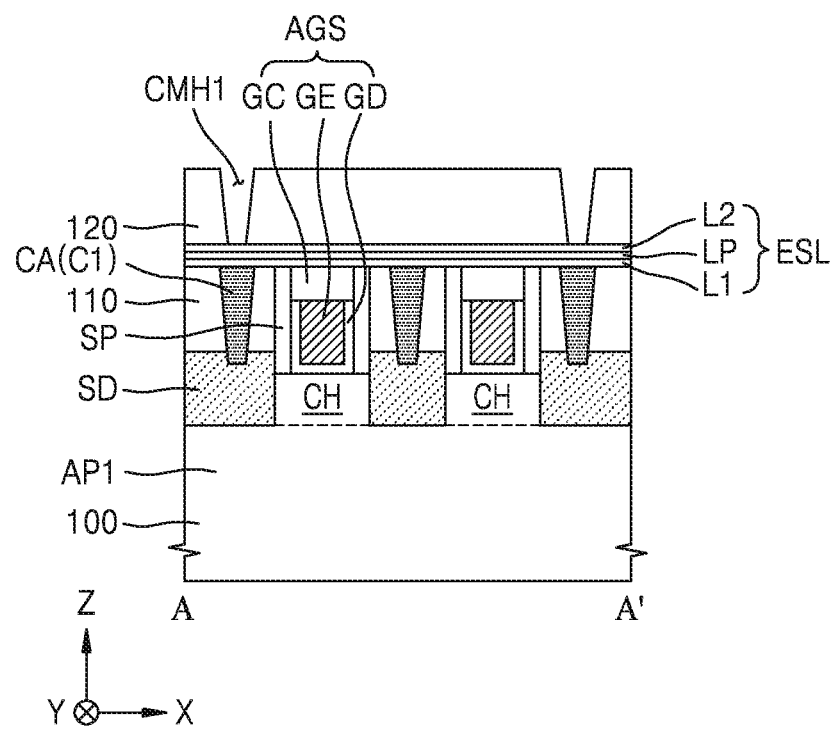
Figure 16B:
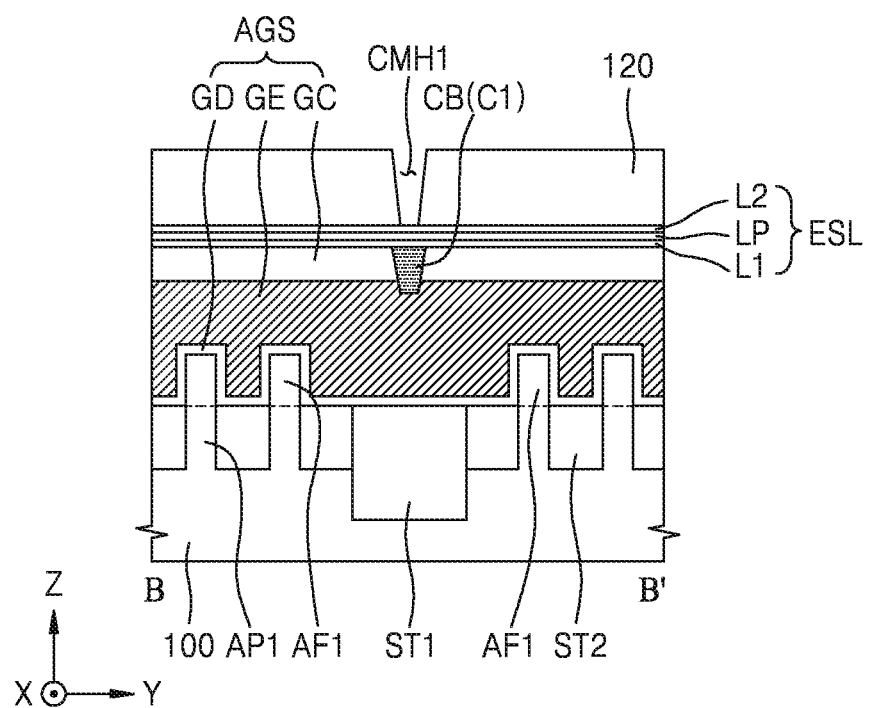
Figure 16C:
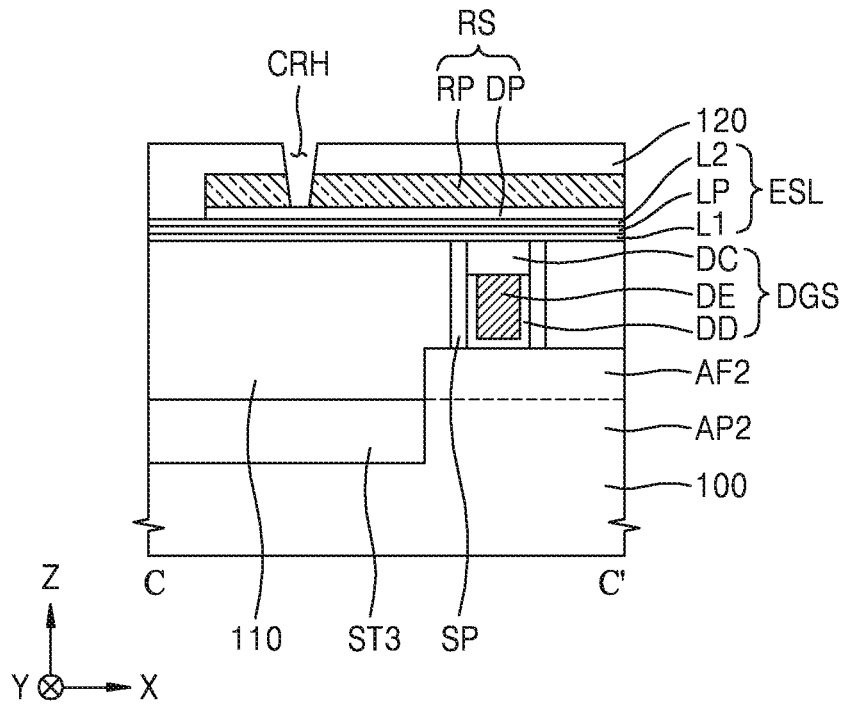

Referring to FIGS. 16A to 16C, a first merged contact hole CMH1 passing through the upper interlayer insulating film 120 and exposing a top surface of the upper etch stop layer L2, and a resistive contact hole CRH sequentially passing through the upper interlayer insulating film 120 and the resistive pattern RP and exposing a top surface of the insulation pattern DP may be formed in the first region R1.

The first merged contact hole CMH1 and the resistive contact hole CRH may be formed by separate patterning processes. For example, the first merged contact hole CMH1 may be formed by a first patterning process and then the resistive contact hole CRH may be formed by a second patterning process, and vice versa. The first merged contact hole CMH1 may be formed to be deeper than the resistive contact hole CRH. Each of the first and second patterning processes may include forming a mask pattern (not shown) on the upper interlayer insulating film 120 and performing the anisotropic etching process using the mask pattern as an etch mask. In other embodiments, the first and second patterning processes may be performed simultaneously.

The upper etch stop layer L2 may be formed of a material having dry etch selectivity with respect to the upper interlayer insulating film 120. Thus, the upper etch stop layer L2 may remain without being etched during a dry etching process performed to form the first merged contact hole CMH1 on the upper interlayer insulating film 120.

Furthermore, the upper etch stop layer L2 limits and/or prevents the first merged contact hole CMH1 from being recessed downward due to over-etching during the dry etching process performed to form the first merged contact hole CMH1. The upper etch stop layer L2 may also limit and/or prevent the occurrence of a recess phenomenon in a cleaning process performed to remove an etch byproduct generated in the dry etching process.

The insulation pattern DP may be formed of a material having dry etch selectivity with respect to the upper interlayer insulating film 120 and the resistive pattern RP. Thus, the insulation pattern DP may remain without being etched during the dry etching process performed to form the resistive contact hole CRH in the upper interlayer insulating film 120 and the resistive pattern RP.

Figure 17A:
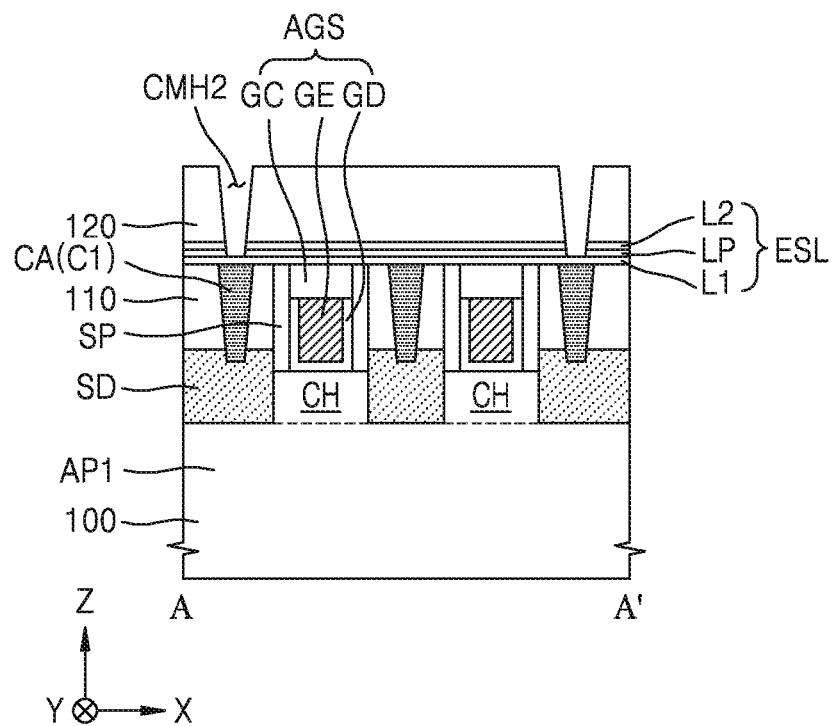
Figure 17B:
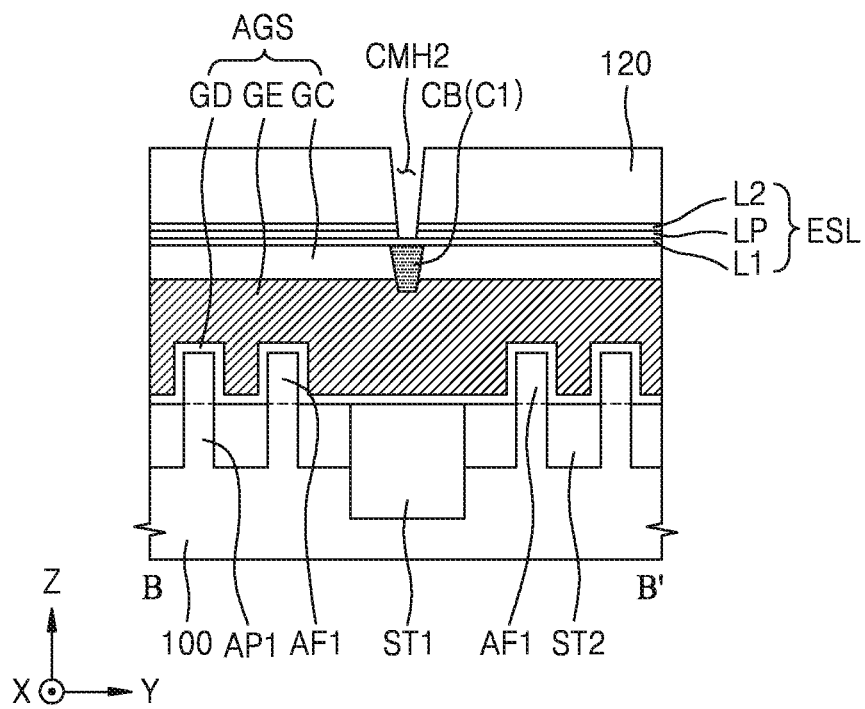
Figure 17C:
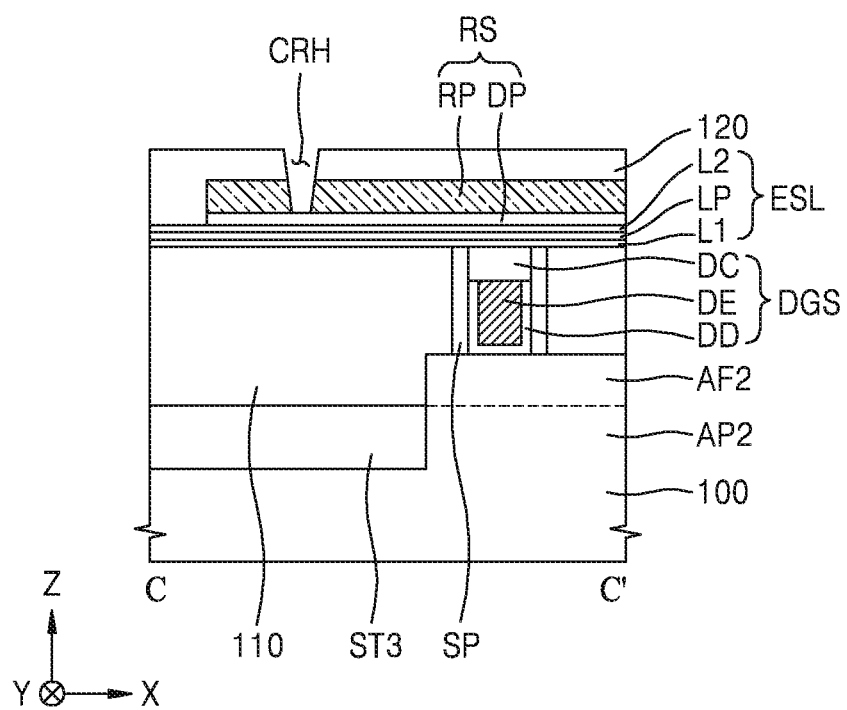

Referring to FIGS. 17A to 17C, a second merged contact hole CMH2 passing through the upper etch stop layer L2 and the passivation layer LP and exposing the top surface of the lower etch stop layer L1 in the first region R1 may be formed.

The second merged contact hole CMH2 may be formed by a patterning process and a cleaning process. The patterning process may include an anisotropic etching process using, as an etch mask, either a mask pattern (not shown) formed on the upper interlayer insulating film 120 or the upper interlayer insulating film 120 formed by patterning the first merged contact hole CMH1 (see FIG. 16C).

The passivation layer LP protects the lower etch stop layer L1 and limits and/or prevents the occurrence of a side effect that oxidizes the lower etch stop layer L1 and thus strengthens resistance to wet etching. The second merged contact hole CMH2 may be removed in the patterning process and the cleaning process, and the passivation layer LP may be removed by the dry etching process, together with the upper etch stop layer L2.

Figure 18A:
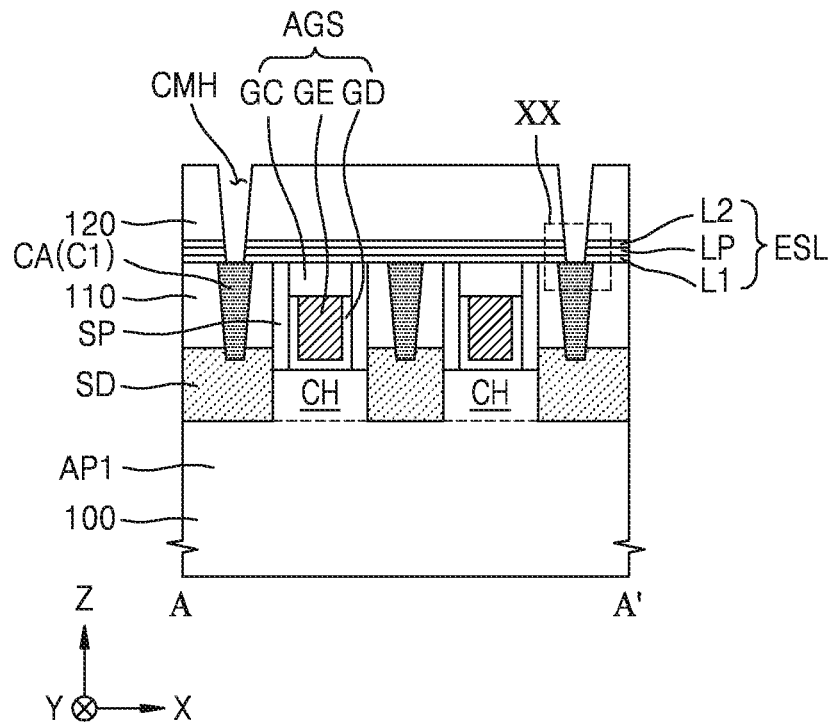
Figure 18B:
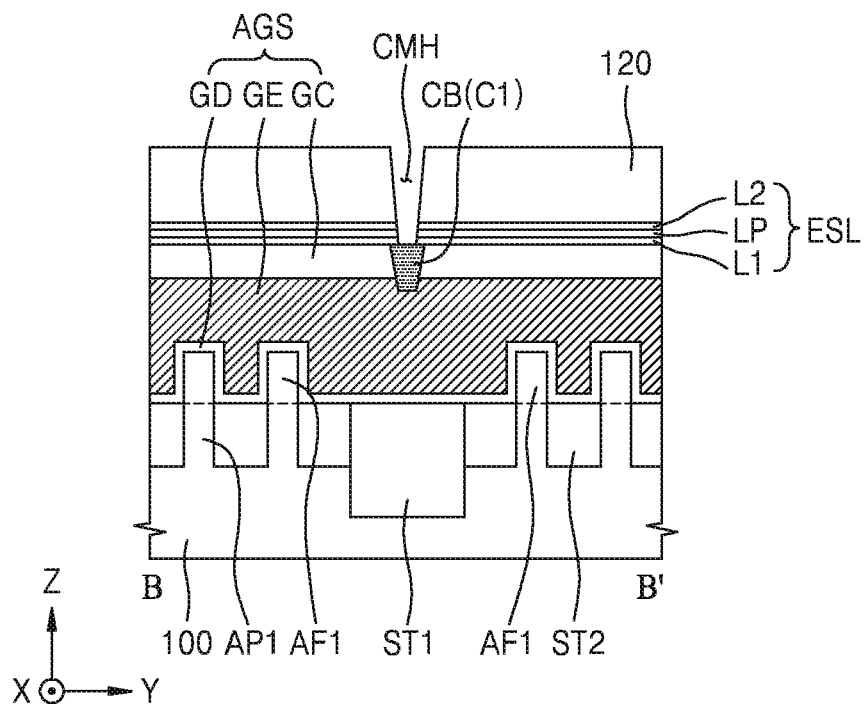
Figure 18C:
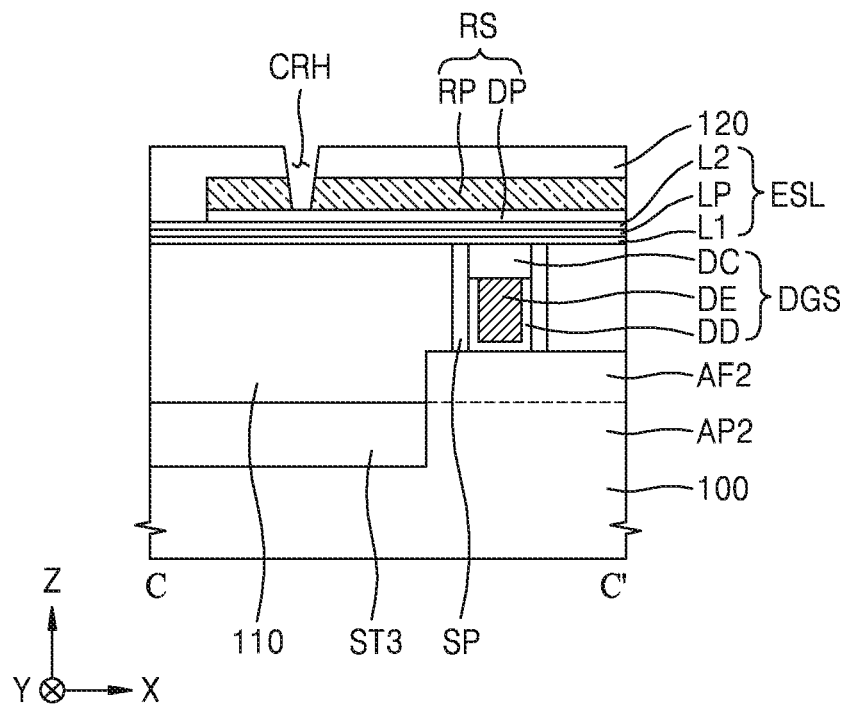

Referring to FIGS. 18A to 18C, a merged contact hole CMH passing through the lower etch stop layer L1 and exposing the top surface of the first conductive contact C1 in the first region R1 may be formed.

The merged contact hole CMH may be formed by a patterning process. The patterning process may include performing an isotropic etching process using, as an etch mask, a mask pattern (not shown) on the upper interlayer insulating film 120 or the upper interlayer insulating film 120 having patterned therein the second merged contact hole CMH2 (see FIG. 17C).

The merged contact hole CMH is formed by patterning the exposed lower etch stop layer L1 by a wet etching process. The lower etch stop layer L1 may be formed of a material which is easily removable by wet etching, and the wet etching process may be performed to expose the top surface of the first conductive contact C1. When the merged contact hole CMH is formed, the wet etching process causing less damage to the top surface of the first conductive contact C1 than the dry etching process may be used.

A top surface of a metal material of the first conductive contact C1 may be limited and/or prevented from being damaged by forming the merged contact hole CMH by the multistep etching process described above with reference to FIGS. 16A to 18C.

Accordingly, in a method of fabricating a semiconductor device according to an embodiment of inventive concepts, the top surface of the first conductive contact C may be limited and/or prevented from being damaged by forming the etch stop layer ESL having a multilayer structure below the resistive structure RS.

Figure 19A:
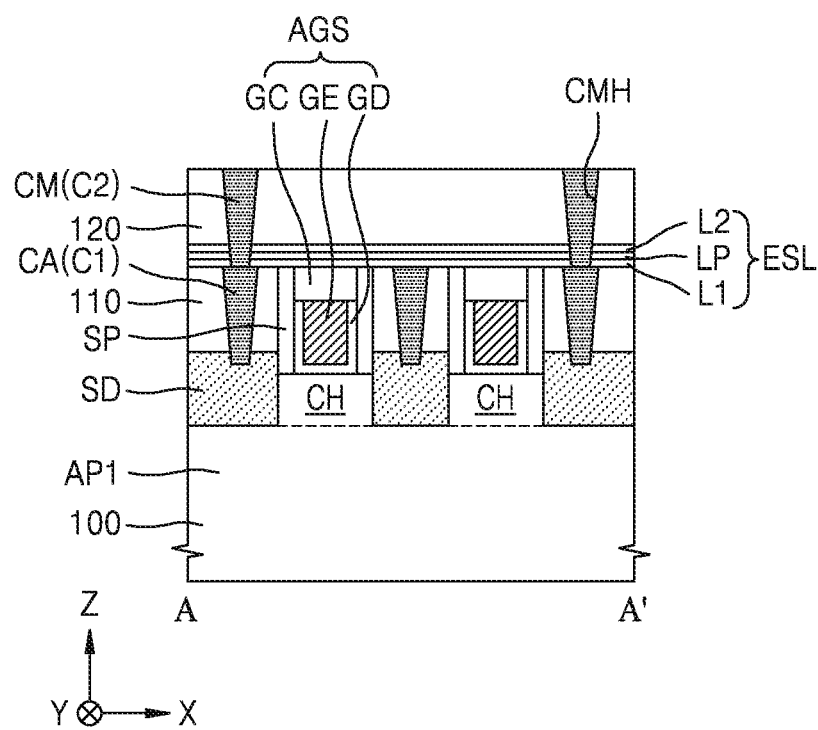
Figure 19B:
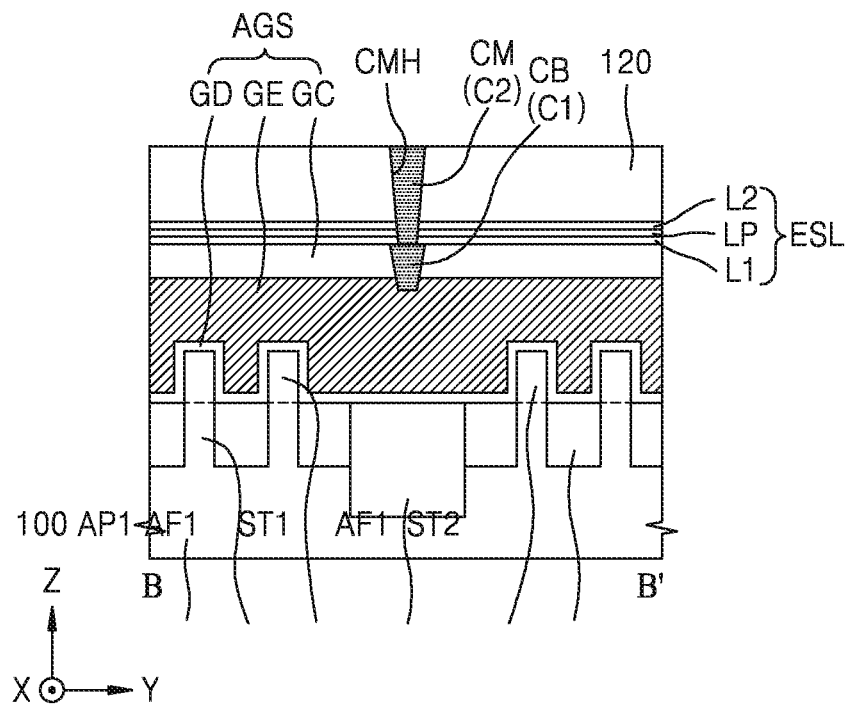
Figure 19C:
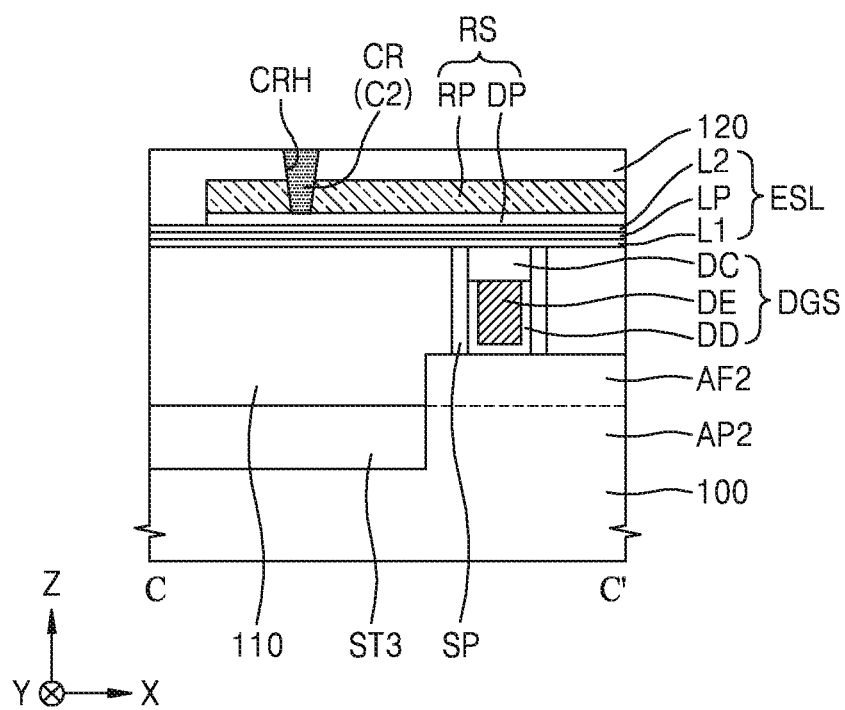

Referring to FIGS. 19A to 19C, a plurality of merged contacts CM being respectively connected to the source/ drain contact CA and the gate contact CB, and a resistive contact CR connected to the resistive structure RS may be formed.

The plurality of merged contacts CM may sequentially pass through the upper interlayer insulating film 120 and the etch stop layer ESL in the first region R1. The resistive contact CR may sequentially pass through the upper interlayer insulating film 120 and the resistive pattern RP in the second region R2.

The plurality of merged contacts CM may be formed in the plurality of merged contact holes CMH, and the resistive contact CR may be formed in the resistive contact hole CRH. In detail, the forming of the plurality of merged contacts CM and the resistive contact CR may include filling a conductive material in the plurality of merged contact holes CMH and the resistive contact hole CRH, and planarizing the conductive material until a top surface of the upper interlayer insulating film 120 is exposed. Thus, top surfaces of the plurality of merged contacts CM and the resistive contact CR may be at substantially the same level as that of the upper interlayer insulating film 120. The conductive material may include at least one of a doped semiconductor material, a metal nitride, and a metal.

Referring back to FIGS. 2A to 2D, first to third wires Ma, Mb, and Mc connected to the merged contacts CM and the resistive contact CR may be formed on the upper interlayer insulating film 120. The first to third wires Ma, Mb, and Mc may include a metal material, e.g., aluminum or copper, and may be formed by a damascene process.

Figure 20:
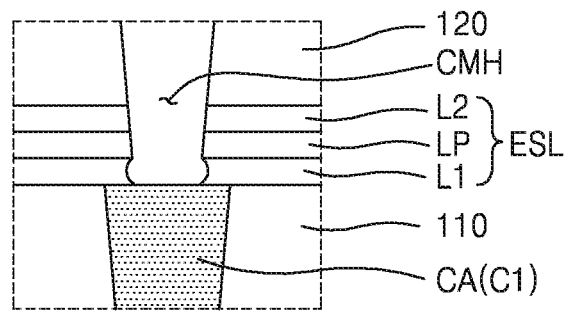
FIG. 20 is an enlarged view of a region XX of FIG. 18A.

FIG. 20 is an enlarged view of a region XX of FIG. 18A.

Referring to FIG. 20, walls forming the lower etch stop layer L1 among sidewalls of the merged contact hole CMH may have a concave shape, and sidewalls forming the passivation layer LP and the upper etch stop layer L2 among the sidewalls of the merged contact hole CMH may have a tapered shape.

As described above, the passivation layer LP and the upper etch stop layer L2 are patterned by dry etching which is anisotropic etching and thus the walls forming the passivation layer LP and the upper etch stop layer L2 among the sidewalls of the merged contact hole CMH may have a tapered shape. In contrast, the lower etch stop layer L1 is patterned by wet etching which is an isotropic etching and thus the walls forming the lower etch stop layer L1 among the walls of the merged contact hole CMH may have a concave shape.

While embodiments of inventive concepts have been described above with reference to the accompanying drawings, it will be understood by those of ordinary skill in the art that inventive concepts may be embodied in many different forms without departing from the scope and essential features thereof. Accordingly, the above-described embodiments should be considered in descriptive sense only and not for purposes of limitation.

What is claimed is:

1. A semiconductor device comprising:
   a substrate including a first region and a second region;
   an active gate structure on the substrate in the first region;
   a dummy gate structure on the substrate in the second region;
   a source/drain on the substrate in the first region at each of opposite sides of the active gate structure;
   a plurality of first conductive contacts respectively connected to the active gate structure and the source/drain;
   a resistive structure on the dummy gate structure in the second region;
   a plurality of second conductive contacts respectively connected to the plurality of first conductive contacts and the resistive structure; and
   an etch stop layer between the dummy gate structure and the resistive structure, the etch stop layer comprising a lower etch stop layer and an upper etch stop layer, a material of the lower etch stop layer being different than a material of the upper etch stop layer.

2. The semiconductor device of claim 1, wherein
   the material of the lower etch stop layer has wet etch selectivity with respect to a material of the plurality of first conductive contacts, and
   the material of the upper etch stop layer has dry etch selectivity with respect to the material of the lower etch stop layer.

3. The semiconductor device of claim 1, wherein
   the plurality of second conductive contacts that contact the etch stop layer include sidewalls that have a convex portion and a tapered portion,
   the lower etch stop layer contacts the convex portion of the sidewalls of the plurality of second conductive contacts, and
   the upper etch stop layer contacts the tapered portion of the sidewalls of the plurality of second conductive contacts.

4. The semiconductor device of claim 1, wherein the etch stop layer further includes a passivation layer between the lower etch stop layer and the upper etch stop layer.

5. The semiconductor device of claim 4, wherein
   the lower etch stop layer includes a metal nitride,
   the passivation layer includes a silicon oxide, and
   the upper etch stop layer includes a silicon nitride.

6. The semiconductor device of claim 1, wherein
   a top surface of the plurality of first conductive contacts is at substantially a same level as a top surface of the active gate structure, and
   a bottom surface of the resistive structure is at a higher level than the top surface of the plurality of first conductive contacts.

7. The semiconductor device of claim 1, wherein
   the resistive structure includes an insulation pattern and a resistive element pattern, and
   the resistive element pattern is on the insulation pattern.

8. The semiconductor device of claim 7, wherein
   a bottom surface of the lower etch stop layer contacts a top surface of the dummy gate structure, and
   a top surface of the upper etch stop layer contacts a bottom surface of the insulation pattern.

9. The semiconductor device of claim 1, wherein a bottom surface of the plurality of second conductive contacts on the plurality of first conductive contacts is at a different level than a bottom surface of the plurality of second conductive contacts on the resistive structure.

10. The semiconductor device of claim 1, wherein a bottom surface of the plurality of second conductive contacts on the plurality of first conductive contacts is at substantially a same level as a bottom surface of the plurality of second conductive contacts on the resistive structure.

11. A semiconductor device comprising:
    a fin region protruding from a substrate;
    a gate structure crossing the fin region, the gate structure covering a top surface and opposite sidewalls of the fin region;
    a source/drain at each of opposite sides of the gate structure in the fin region;
    a source/drain contact connected to the source/drain;
    a gate contact connected to the gate structure;

an etch stop layer on the gate structure, the etch stop layer including a lower etch stop layer, a passivation layer, and an upper etch stop layer sequentially stacked on top of each other;

a resistive structure on the etch stop layer;

a plurality of merged contacts connected to the source/drain contact or the gate contact, respectively; and a resistive contact connected to the resistive structure.

12. The semiconductor device of claim 11, wherein the plurality of merged contacts pass through the etch stop layer.

13. The semiconductor device of claim 12, wherein the plurality of merged contacts that contact the etch stop layer include sidewalls that have a convex portion and a tapered portion, the lower etch stop layer contacts the convex portion of the sidewalls of the plurality of merged contacts, and the upper etch stop layer contacts the tapered portion of the sidewalls of the plurality of merged contacts.

14. The semiconductor device of claim 11, wherein the resistive structure includes an insulation pattern and a resistive element pattern, the insulation pattern is on the etch stop layer, and sidewalls of the insulation pattern and sidewalls of the resistive element pattern are located on a same plane.

15. The semiconductor device of claim 11, wherein a top surface of the source/drain contact, a top surface of the gate contact, and a top surface of the gate structure are at substantially a same level, a bottom surface of the resistive structure is at a higher level than the top surface of the source/drain contact and the top surface of the gate contact, and the top surface of the plurality of merged contacts and a top surface of the resistive contact are at substantially a same level.

\* \* \* \* \*